United States Patent
Nishioka et al.

(10) Patent No.: US 6,657,249 B2
(45) Date of Patent: Dec. 2, 2003

(54) NONVOLATILE SEMICONDUCTOR MEMORY DEVICE WITH PERIPHERAL CIRCUIT PART COMPRISING AT LEAST ONE OF TWO TRANSISTORS HAVING LOWER CONDUCTIVE LAYER SAME PERPENDICULAR STRUCTURE AS A FLOATING GATE

(75) Inventors: Naho Nishioka, Hyogo (JP); Naoki Tsuji, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/189,575

(22) Filed: Jul. 8, 2002

(65) Prior Publication Data

US 2003/0127681 A1 Jul. 10, 2003

(30) Foreign Application Priority Data

Jan. 8, 2002 (JP) .................................... 2002-001138

(51) Int. Cl.$^7$ ............................................ H01L 29/788
(52) U.S. Cl. ........................ 257/315; 257/316; 257/317; 257/318; 438/201; 438/211; 438/257
(58) Field of Search ....................... 257/298, 315–323; 438/201, 211, 257, 260, 262–264, 266, 594

(56) References Cited

U.S. PATENT DOCUMENTS 5,326,999 A * 7/1994 Kim et al. ................... 257/315
5,712,178 A * 1/1998 Cho et al. ................... 438/201
5,793,081 A * 8/1998 Tomioka et al. ............. 257/319

FOREIGN PATENT DOCUMENTS

JP          3-283570          12/1991

OTHER PUBLICATIONS

Y. Takeuchi, et al, "A Self–Aligned STI Process Integration for Low Cost and Highly Reliable 1Gbit Flash Memories" 1998 Symposium on VLSI Technology Digest of Technical Papers, p. 102.

* cited by examiner

Primary Examiner—David Nelms
Assistant Examiner—Long Tran
(74) Attorney, Agent, or Firm—McDermott, Will & Emery

(57) ABSTRACT

A nonvolatile semiconductor memory device capable of readily distinctively forming transistors in a peripheral circuit part and a transistor in a memory cell part while minimizing the number of times of high-temperature heat treatment are obtained. In the peripheral circuit part, at least one of a first transistor and a second transistor has a lower conductive layer having the same perpendicular structure as a floating gate, an intermediate insulator film including an insulator film of the same perpendicular structure as an inter-gate isolation film and an upper conductive layer of the same perpendicular structure as a conductive layer of a control gate in ascending order on a gate insulator film thereof, and the intermediate insulator film includes a conduction part electrically connecting the upper conductive layer and the lower conductive layer with each other.

8 Claims, 43 Drawing Sheets

NONVOLATILE SEMICONDUCTOR MEMORY DEVICE WITH PERIPHERAL CIRCUIT PART COMPRISING AT LEAST ONE OF TWO TRANSISTORS HAVING LOWER CONDUCTIVE LAYER SAME PERPENDICULAR STRUCTURE AS A FLOATING GATE

BACKGROUND OF THE INVENTION

1. Field of the Invention

The present invention relates to a nonvolatile semiconductor memory device, and more specifically, it relates to a nonvolatile semiconductor memory device capable of readily distinctively forming a transistor in a memory cell part and transistors in a peripheral circuit part while reducing the number of times of high-temperature heat treatment.

2. Description of the Background Art

Referring to FIG. 34, a conventional nonvolatile semiconductor memory device is divided into a memory cell part R1 and a peripheral circuit part R2 located in the periphery thereof. A memory cell transistor 150 is arranged on the memory cell part R1 while two types of transistors 161 and 162 are arranged on the peripheral circuit part R2. The difference between the two types of transistors 161 and 162 resides in difference between the thicknesses of gate insulator films 127 and 137, as described later.

FIG. 34 shows the memory transistor 150 of the memory cell part R1 in two sections along bit and word lines respectively. An n-conductivity type bottom well 103 is provided at a part of the bottom of a silicon substrate 101 formed in the memory cell part R1 isolated from the peripheral circuit part R2 by an element isolation zone 102. A p-conductivity type well 105 is formed at the n-conductivity type bottom well 103. The memory cell transistor 150 has source and drain regions 108a and 180b formed in the p-conductivity type well 105 and a gate insulator film 106 arranged on the silicon substrate 101. A floating gate 107 enclosed with an insulating region 109 is arranged on the gate insulator film 106. An inter-gate isolation film 110 consisting of a three-layer insulator film including a silicon oxide film, a silicon nitride film and a silicon oxide film is formed on the floating gate 107. A control gate 113 is arranged on the inter-gate isolation film 110. A layer 114 of WSi and an insulator film 115 are arranged on the control gate 113.

An n-conductivity type well 104 and a p-conductivity type well 105 are provided on the peripheral circuit part R2. The two types of transistors 161 and 162 are provided in each of the wells 104 and 105. The transistor 161 has a gate oxide film 127, and the transistor 162 has a gate oxide film 137 having a larger thickness than the gate oxide film 127. Conductive layers 113 of the same perpendicular structure as the control gate 113, WSi films 114 and insulator films 115 are provided on the gate oxide films 127 and 137 respectively. In the peripheral circuit part R2, the transistors 161 and 162 include low-concentration impurity regions 116 and 117 provided on the silicon substrate 101 and high-concentration impurity regions 119 and 120 formed by implanting an impurity through masks defined by side wall spacers provided on the side surfaces of gate electrodes. Plug wires 125 conductive with wires 126 arranged on an interlayer dielectric film 124 are connected to the high-concentration impurity regions 119 and 120.

A method of fabricating the conventional nonvolatile semiconductor memory device is now described with reference to FIGS. 35 to 43.

First, the element isolation zone 102 is formed on the main surface of the p-conductivity type silicon substrate 101 having <100>crystal orientation (see FIG. 35). Then, a resist pattern is formed on the main surface of the silicon substrate 101 as a mask for ion-implanting phosphorus into the memory cell part R1 with acceleration energy of 3 MeV and density of 1.0E13, for example, thereby forming the n-conductivity type bottom well region 103, and the resist pattern is removed. In the following description, processing of removing a resist film is not described.

Then, phosphorus is ion-implanted into the region of the peripheral circuit part R2 to be formed with p-conductivity type MOS (metal oxide semiconductor) transistors with acceleration energy of 1.2 MeV and density of 1.0E13, for example, through a resist pattern serving as a mask. Further, phosphorus for channel cutting and boron for counter doping are ion-implanted into the same region with 700 keV and 3.0 E 12 and with 20keV and 1.5 E12 respectively, for example. The n-conductivity type well region 104 is formed by this ion implantation (see FIG. 35).

Then, the p-conductivity type well regions 105 are formed in the region of the peripheral circuit part R2 to be formed with n-conductivity type MOS transistors and a region of the memory cell part R2 to be formed with a memory cell through a resist pattern serving as a mask in the following three stages (a), (b) and (c) (see FIG. 35): (a) Boron is ion-implanted with acceleration energy of 700 keV and density of about 1.0E13, for example. (b) Boron for p-channel cutting is ion-implanted with acceleration energy of 270 keV and density of 3.5E12, for example. (c) Boron for channel doping is ion-implanted with acceleration energy of 50 keV and density of 1.2E12, for example.

Thereafter a silicon oxide film 106 of about 10 nm in thickness is formed on the main surface of the silicon substrate 101 by thermal oxidation. Then, a phosphorus-doped polycrystalline silicon film 107 of about 200 nm in thickness is formed. Thereafter a resist pattern is formed on the overall main surface of the silicon substrate 101 by photolithography. This resist pattern is employed as a mask for patterning the phosphorus-doped polycrystalline silicon film 107 thereby forming the floating gate 107 on the region to be formed with the memory transistor 150.

Then, arsenic is ion-implanted into the region of the silicon substrate 101 to be formed with the memory cell with acceleration energy of 35 keV and density of about 3.0E15, for example, through a resist pattern serving as a mask for forming n-conductivity type impurity diffusion regions as the source and drain regions 108a and 108b. Thereafter a silicon oxide film 109 of 800 nm in thickness is deposited on the silicon substrate 101 by low-pressure CVD (chemical vapor deposition). The overall surface of this silicon oxide film 109 is etched thereby exposing the surface of the phosphorus-doped polycrystalline silicon film 107 (see FIG. 35).

Then, the three-layer insulator film 110 is formed on the main surface of the silicon substrate 101. In formation of the three-layer insulator film 110, a silicon oxide film of 5 nm in thickness is first formed by thermal oxidation. Then, a silicon nitride film of 10 nm in thickness is formed thereon by low-pressure CVD. Further, another silicon oxide film of 5 nm in thickness is formed thereon by low-pressure CVD, thereby defining the three-layer insulator film 110.

Thereafter a resist pattern is formed on the silicon substrate 101 by photolithography. This resist pattern is employed for patterning the three-layer insulator film 110, the phosphorus-doped polycrystalline silicon film 107 and the gate oxide film 106 on the peripheral circuit part R2, as shown in FIG. 35.

Thereafter silicon oxide films 111 of about 20 nm in thickness are formed on the regions of the peripheral circuit part R2 to be formed with thick gate insulator films, i.e., to be formed with high withstand voltage transistors. At this time, the silicon nitride film included in the three-layer insulator film 110 prevents the underlayer from thermal oxidation in the memory cell part Rd. Then, resist patterns are formed on the regions of the peripheral circuit part R2 to be formed with the high withstand voltage transistors and the memory cell part R1 by photolithography for patterning the silicon oxide films 111 in regions of the peripheral circuit part R2 to be formed with low withstand voltage transistors (FIG. 36).

A silicon oxide film 127 of about 10 nm for defining the gate oxide films of the low withstand voltage transistors of the peripheral circuit part R2 is grown on the silicon substrate 101 by thermal oxidation. At this time, the silicon nitride film included in the three-layer insulator film 110 prevents the underlayer from thermal oxidation in the memory cell part R1. On the other hand, a silicon oxide film 137 for defining the gate oxide films of the high withstand voltage transistors of the peripheral circuit part R2 is larger than 20 nm and smaller than 30 nm in thickness. Then, a phosphorus-doped polycrystalline silicon film 113 of about 200 nm in thickness, a WSi film 114 of about 100 nm in thickness and a silicon oxide film 115 of about 200 nm in thickness are successively deposited in ascending order. Thereafter a resist pattern is formed by photolithography and employed as a mask for patterning the silicon oxide film 115. The patterned silicon oxide films 115 are employed as masks for patterning the WSi film 114 and the phosphorus-doped polycrystalline silicon film 113 (FIG. 37).

Thereafter the phosphorus-doped polycrystalline silicon film 113, the WSi film 114 and the silicon oxide film 115 of about 200 nm in thickness in the memory cell part R1 of the silicon substrate 101 are employed as masks for patterning the three-layer insulator film 110 and the phosphorus-doped polycrystalline silicon film 107 (FIG. 38).

Then, phosphorus is ion-implanted into the region of the silicon substrate 101 to be formed with n-conductivity type MOS transistors of the eripheral circuit part R2 with acceleration energy of 50 keV and density of about 4.0E13 through a resist pattern serving as a mask. Thus, the low-concentration impurity regions 116 of the n-conductivity MOS transistors of the peripheral circuit part R2 are formed (FIG. 39).

Then, boron is ion-implanted into the region of the silicon substrate 101 to be formed with p-conductivity type MOS transistors of the peripheral circuit part R2 with acceleration energy of 50 keV and density of about 1.5E13 through a resist pattern serving as a mask. Thus, the low-concentration impurity regions 117 of the p-conductivity type MOS transistors are formed in the peripheral circuit part R2 (FIG. 40). A silicon oxide film of about 100 nm is formed on the silicon substrate 101 by CVD. Then, side wall spacers 123 are formed by anisotropic etching (FIG. 41).

Then, arsenic is ion-implanted into the region of the silicon substrate 101 to be formed with the n-conductivity type MOS transistors of the peripheral circuit part R2 with acceleration energy of 35 keV and density of about 4.0E15, for example, through a resist pattern serving as a mask.

Thus, the high-concentration impurity regions 119 of the n-conductivity type MOS transistors are formed (FIG. 42).

Further, $BF_2$ is ion-implanted into the region of the silicon substrate 101 to be formed with the p-conductivity type MOS transistors of the peripheral circuit part R2 with acceleration energy of 20 keV and density of 2.0E15, for example, through a resist pattern serving as a mask. Thus, the high-concentration impurity regions 120 of the p-conductivity type MOS transistors are formed (FIG. 43). Thereafter wires are formed through general wire formation. The conventional nonvolatile semiconductor memory device is fabricated through the aforementioned method.

In the nonvolatile semiconductor memory device, a high voltage $V_{PP}$ of about 20 V is generally applied to the control gate 113 while grounding the n-conductivity type diffusion regions 108a and 108b and the silicon substrate 101 in program formation. Thus, electrons are generated in a channel formed between the n-conductivity type diffusion layers 180a and 108b. These electrons tunnel through an energy barrier formed by the tunnel insulator film 106 and are injected into the floating gate 107. Consequently, the threshold voltage of the memory cell is increased.

In program erasing, a high voltage VPP of about –20 V is generally applied to the control gate 113 while grounding the n-conductivity type diffusion regions 108a and 108b and the silicon substrate 101. Tunneling results from this circuit formation, to discharge electrons from the floating gate 107 to the silicon substrate 101. Consequently, the threshold voltage of the memory cell is reduced.

In a read operation of a selected memory transistor, voltages of 3.3 V (Vcg=3.3 V) are applied to the control gate 113 and the drain 108a of the n-conductivity type diffusion layer while grounding the source 108b of the n-conductivity type diffusion layer and the silicon substrate 101. Assuming that $V_{thp}$ >3.3 V >$V_{the}$, no current flows between the source 108b and the drain 108a of the memory transistor in a reading state while a current flows in a program erasing state.

In reading, the control gate 113 is grounded (Vcg=0 V), a voltage of 3.3 V is applied to the drain 108a of the n-conductivity type diffusion region, and the source 108b of the n-conductivity type diffusion region and the silicon substrate 101 are grounded in a non-selected transistor. Assuming that $V_{thp}$ >$V_{the}$ >0 V, no current flows between the source 108b and the drain 108a of the memory transistor if the voltage Vcg is 0 V.

A current flows between the source 108b and the drain 108a only in a memory transistor of a program reading state among selected ones, so that information can be detected from each memory cell.

Therefore, the peripheral circuit part R2 of the nonvolatile semiconductor memory device requires two types of transistors, i.e., (1) a low withstand voltage transistor having a thin gate oxide film with high current drivability for increasing the speed for the reading operation and (2) a high withstand voltage transistor having a gate oxide film capable of withstanding a high applied voltage.

In the conventional fabrication method, however, the memory cell transistor and the two types of transistors having gate oxide films of different thicknesses in the peripheral circuit part must be formed independently of each other. Therefore, high-temperature heat treatment must be performed a number of times for forming the gate oxide films with a long time. This leads to the following problems:

(1) The number of thermal oxidation steps requiring a high cost is increased.

(2) Diffusion regions formed by ion implantation are spread due to exposure to high-temperature heat treatment over a long time, to inhibit refinement of semiconductor elements.

(3) The number of high-temperature heat treatment steps is so large that stress is applied to a portion of the silicon substrate 101 around the element isolation zone 102 due to difference between the thermal expansion coefficients of the silicon oxide film and the silicon substrate 101 to cause crystal defects in the silicon substrate 101.

SUMMARY OF THE INVENTION

An object of the present invention is to provide a nonvolatile semiconductor memory device and a method of fabricating the same capable of distinctively forming transistors of a peripheral circuit part and a memory cell part while minimizing the number of times of high-temperature heat treatment, particularly capable of readily distinctively forming a high withstand voltage transistor and a low withstand voltage transistor directed to improvement of the operating speed in the peripheral circuit part.

The nonvolatile semiconductor memory device according to the present invention comprises a memory cell part and a peripheral circuit part located in the periphery of the memory cell part on a semiconductor substrate. The memory cell part includes a memory cell transistor having a floating gate located on a gate insulator film, an inter-gate isolation film located on the floating gate and a control gate located on the inter-gate isolation film. The peripheral circuit part includes a first transistor including a first gate insulator film and a second transistor including a second gate insulator film. In this nonvolatile semiconductor memory device, at least one of the first and second transistors includes a lower conductive layer, an intermediate insulator film and an upper conductive layer located in ascending order on the gate insulator film in contact with each other. The lower conductive layer has the same perpendicular structure as the floating gate, the intermediate insulator film includes an insulator film of the same perpendicular structure as the inter-gate isolation film, and the upper conductive layer has the same perpendicular structure as the conductive layer of the control gate. Further, the intermediate insulator film includes a conduction part electrically connecting the upper conductive layer and the lower conductive layer with each other.

According to this structure, the floating gate, and the control gate isolated from each other by the isolation film in the memory cell part can be electrically connected with each other in the peripheral circuit part. In the peripheral circuit part, therefore, either one of the floating gate and the control gate can be employed as a gate electrode. Therefore, (A) a gate portion of the nonvolatile transistor of the memory cell part and gate portions of the transistors of the peripheral circuit part can be simultaneously formed in the same perpendicular structure, for reducing the number of fabrication steps. Further, for example, (B) the number of the fabrication steps can be further reduced by simultaneously forming a gate oxide film of the nonvolatile transistor and a gate oxide film of the first transistor, for example, of the peripheral circuit part in common with the same peripheral structure. Consequently, (B1) thermal oxidation can be suppressed for suppressing crystal defects in the semiconductor substrate. Further, heat history applied to the semiconductor substrate is so reduced that (B2) impurity diffusion regions are not enlarged in size, not to inhibit the nonvolatile semiconductor memory device from miniaturization.

In general, the aforementioned first and second transistors are classified into a high withstand voltage transistor and a transistor directed to a high-speed operation with no requirement for high voltage resistance respectively. In other words, first and second gate oxide films are different in thickness from each other. However, the present invention is not necessarily restricted to the aforementioned classification but another classification may alternatively be employed. The aforementioned first and second transistors are formed in each of n- and p-conductivity type wells.

The wording "lower conductive layer having the same perpendicular structure as the floating gate" indicates that the same layer as the floating gate is formed on the peripheral circuit part in formation of the floating gate and employed as the lower conductive layer. This also applies to the remaining layers. When two layers have the same perpendicular structure, therefore, the layers are identical in (a) perpendicular size and (b) perpendicular chemical composition distribution to each other.

Each of the first and second transistors includes the lower conductive layer of the same perpendicular structure as the floating gate, the intermediate insulator film including the insulator film of the same perpendicular structure as the inter-gate isolation film and the upper conductive layer of the same perpendicular structure as the control gate on the gate insulator film.

The first transistor includes the lower conductive layer of the same perpendicular structure as the floating gate, the intermediate insulator film including the insulator film of the same perpendicular structure as the inter-gate isolation film and the upper conductive layer of the same perpendicular structure as the control gate on the first gate insulator film. The second transistor can include a conductive layer of the same perpendicular structure as the control gate on the second gate insulator film.

Also according to this structure, functions/effects identical to the above inventive functions/effects (A), (B), (B1) and (B2) can be attained.

The method of fabricating a nonvolatile semiconductor memory device according to the present invention comprises steps of forming a lower insulator film on a region of the peripheral circuit part on the semiconductor substrate formed with the second transistor, forming the gate insulator film covering the semiconductor substrate and the lower insulator film, forming a floating conductive layer defining the floating gate on the gate insulator film, forming the inter-gate isolation film on the floating conductive layer, and opening a through hole reaching the floating conductive layer in regions of the inter-gate isolation film formed with the first and second transistors.

According to this method, the gate insulator films of the first transistor and the memory transistor can be simultaneously fabricated in common in the same composition. The thickness of the gate insulator film of the second transistor can be increased beyond that of the gate insulator film of the first transistor by the thickness of the lower insulator film. In the aforementioned method, the gate oxide films of the transistors may not be separately formed for the memory cell part and the peripheral circuit part, whereby thermal oxidation is suppressed. Therefore, crystal defects can be suppressed in the semiconductor substrate. Heat treatment history applied to the semiconductor substrate is suppressed, whereby an impurity diffusion region can be inhibited from spreading, not to inhibit refinement of the nonvolatile semiconductor memory device.

Another method of fabricating a nonvolatile semiconductor memory device according to the present invention comprises a step of successively stacking a gate insulator film, a floating conductive layer for defining the floating gate on the gate insulator film and the inter-gate isolation film on the conductive layer in common to the memory cell part and the peripheral circuit part. The method further comprises steps of partially removing the successively stacked gate insulator film, floating conductive layer and inter-gate isolation film only in the range of regions formed with the second transistor in plan view for exposing the semiconductor substrate and forming the second gate insulator film having a larger thickness than the gate insulator film only on the region of the second transistor. The method further comprises steps of opening a through hole reaching the floating conductive layer in a region of the inter-gate isolation film formed with the first transistor and forming a control conductive layer defining the control gate to fill up the through hole and cover the second gate insulator film over the memory cell part and the peripheral circuit part.

According to this method, the gate oxide films of the first transistor and the memory transistor can be formed through a common step for reducing the number of fabrication steps also when only the first transistor has the insulator film of the same perpendicular structure as the inter-gate isolation film of the memory cell part for the gate electrode and only the upper conductive layer is stacked for the second transistor, thereby reducing the number of steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
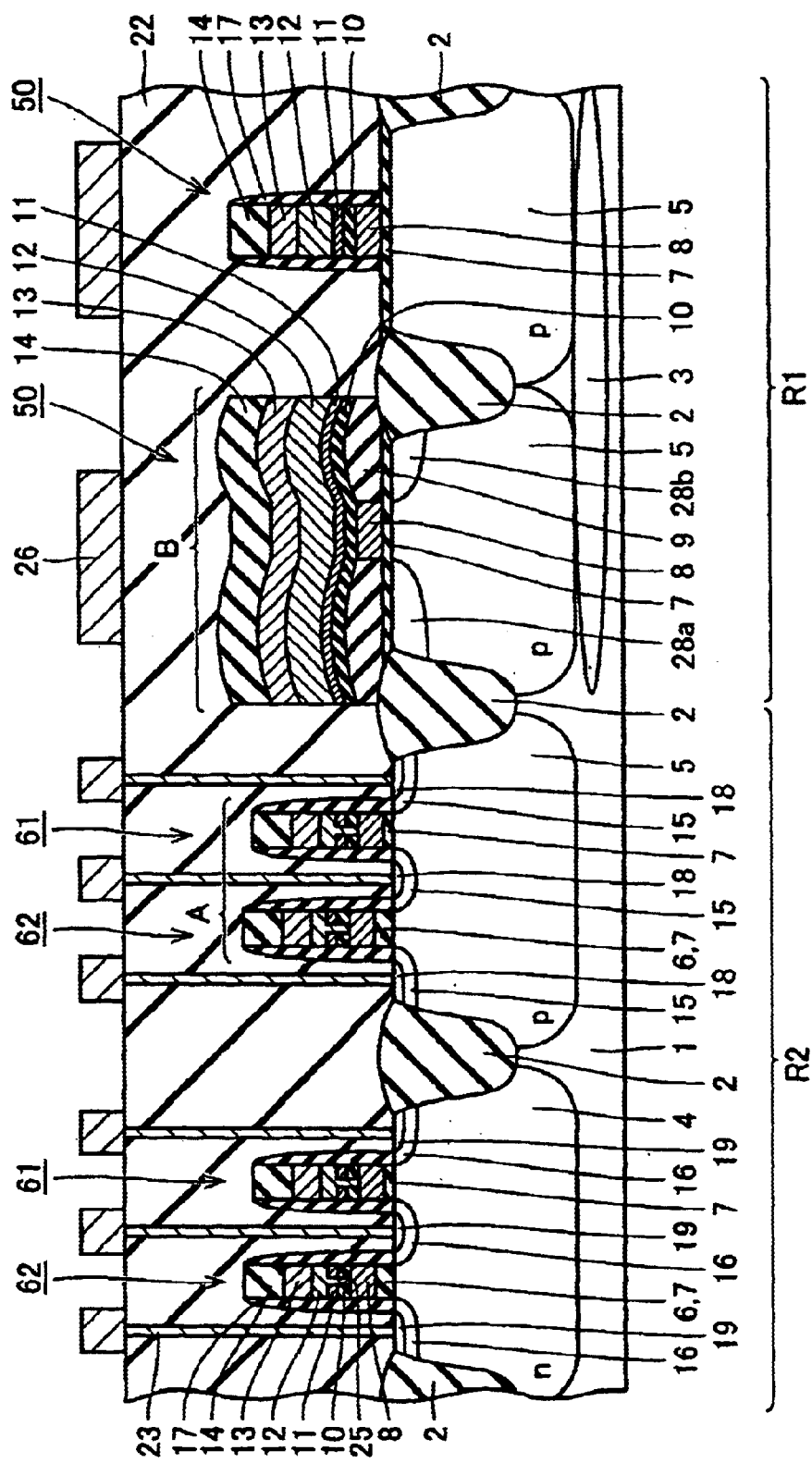
FIG. 1 is a sectional view of a nonvolatile semiconductor memory device according to a first embodiment of the present invention.

Referring to FIG. 1, a nonvolatile semiconductor memory device according to a first embodiment of the present invention is divided into a memory cell part R1 and a peripheral circuit part R2 located in the periphery thereof. A memory cell transistor 50 is arranged on the memory cell part R1 while two types of transistors 61 and 62 are arranged on an n-conductivity type well 4 and a p-conductivity type well 5 of the peripheral circuit part R2 respectively. The two types of transistors 61 and 62 are different in thickness of gate insulator films from each other, as described later.

FIG. 1 shows sections of the memory cell transistor 50 of the memory cell part R1 along a right-side bit line and a left-side word line respectively. An n-conductivity type bottom well 3 is provided on the bottom of a part of a silicon substrate 1 formed with the memory cell part R1 isolated from the peripheral circuit part R2 by an element isolation zone 2, and a p-conductivity type well 5 is formed on the n-conductivity type bottom well 3. The memory cell transistor 50 has n-conductivity type source and drain regions 28a and 28b located in the p-conductivity type well 5 and a gate insulator film 7 arranged on the silicon substrate 1. A floating gate 8 of a conductive layer enclosed with an insulating region 9 is arranged on the gate insulator film 7. An inter-gate isolation film 10 consisting of a three-layer insulator film including a silicon oxide film, a silicon nitride film and a silicon oxide film is formed on the floating gate 8. A phosphorus-doped polycrystalline silicon film 11 is arranged on the inter-gate isolation film 10 and a control gate 12 of a conductive layer is arranged on the phosphorus-doped polycrystalline silicon film 11, while a WSi layer 13 is arranged on the control gate 12 and an insulator film 14 is arranged on the WSi layer 13.

The peripheral circuit part R2 is provided with the n-conductivity type well 4 and the p-conductivity type well 5 each having the two types of transistors 61 and 62 respectively as hereinabove described. The transistor 61 has a gate oxide film 7, and the transistor 62 has a gate oxide films 6,7 having a larger thickness than the gate oxide film 7. The transistors 61 and 62 have the same multilayer structures as the memory transistor 50 on the gate oxide films 6 and 7. In other words, floating gates 8 are arranged on the gate oxide films 6 and 7 and inter-gate isolation films 10 are located on the floating gates 8, while phosphorus-doped polycrystailine silicon films 11, control gates 12, WSi layers 13 and insulator films 14 are successively stacked thereon.

Figure 2:
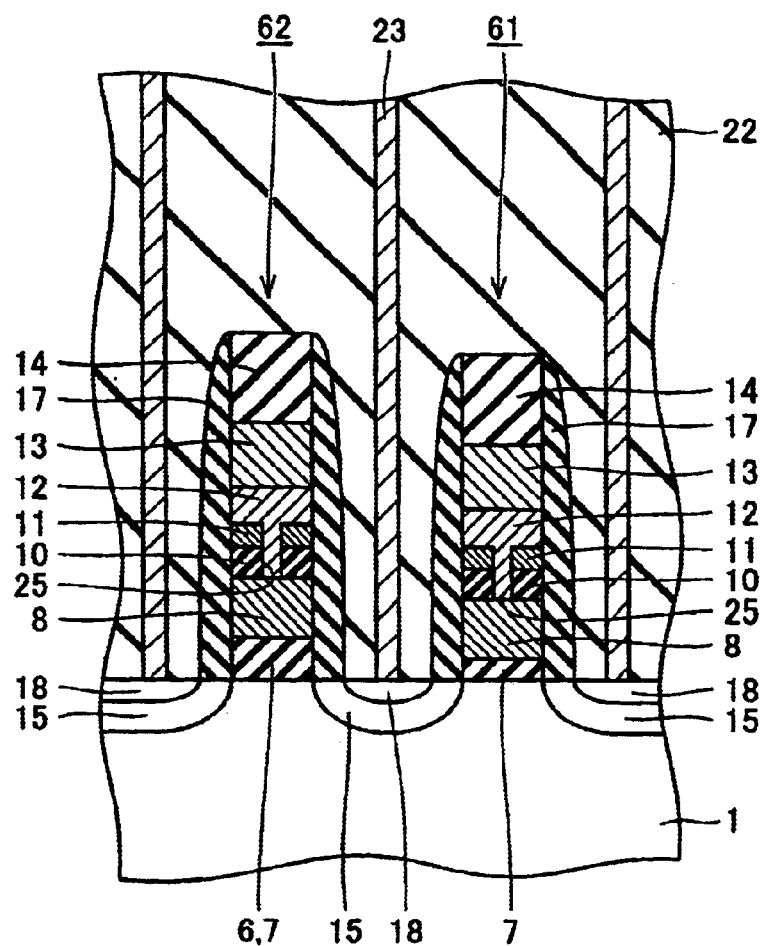
FIG. 2 is an enlarged view of a part A in FIG. 1.
Figure 3:
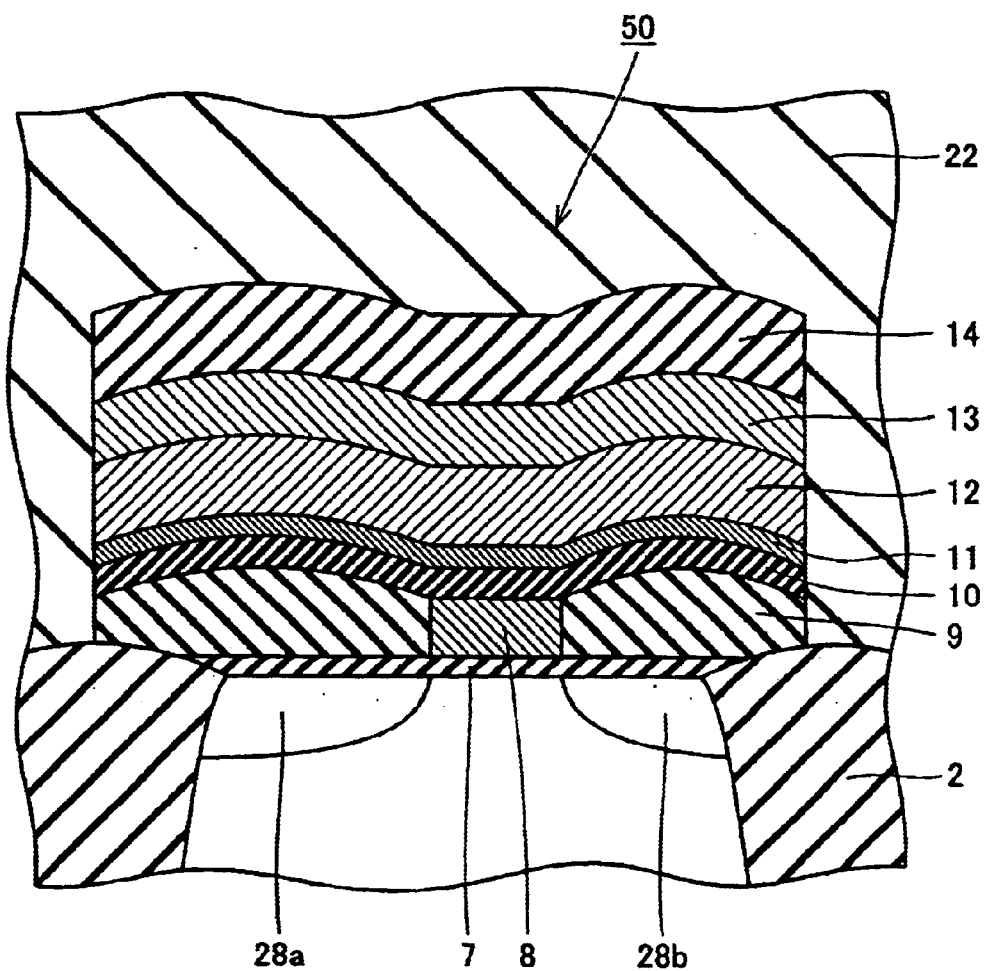
FIG. 3 is an enlarged view of a part B in FIG. 1.

FIG. 2 is an enlarged view of a part A shown in FIG. 1. As shown in FIG. 2, through holes are formed in the inter-gate isolation films 10 for defining conduction parts rendering the floating gates 8 and the control gates 12 conductive. The floating gates 8 and the control gates 12 can be employed as gate electrodes of general transistors due to the conduction parts. FIG. 3 is an enlarged view of a part B shown in FIG. 1. Comparing FIGS. 2 and 3 with each other, it is understood that the memory transistor 50 of the memory cell part R1 and the two types of transistors 61 and 62 of the peripheral circuit part R2 have the same multilayer structures of gate portions formed by the gate oxide films 6 and 7 and the films located thereon. Therefore, the gate electrodes of the transistor 61 and 62 of the peripheral circuit part R2 can be fabricated at the same timing as the gate portion of the memory transistor 50 including the floating gate 8 and the control gate 12.

In the peripheral circuit part R2, the transistors 61 and 62 include low-concentration impurity regions 15 and 16 provided on the silicon substrate 1 and high-concentration impurity regions 18 and 19 formed by implanting an impurity through side wall spacers 17 provided on the side surfaces of the gate electrodes. Plug wires 23 conducting with wires 26 arranged on an interlayer dielectric film 22 are connected to the high-concentration impurity regions 18 and 19.

Figure 4:
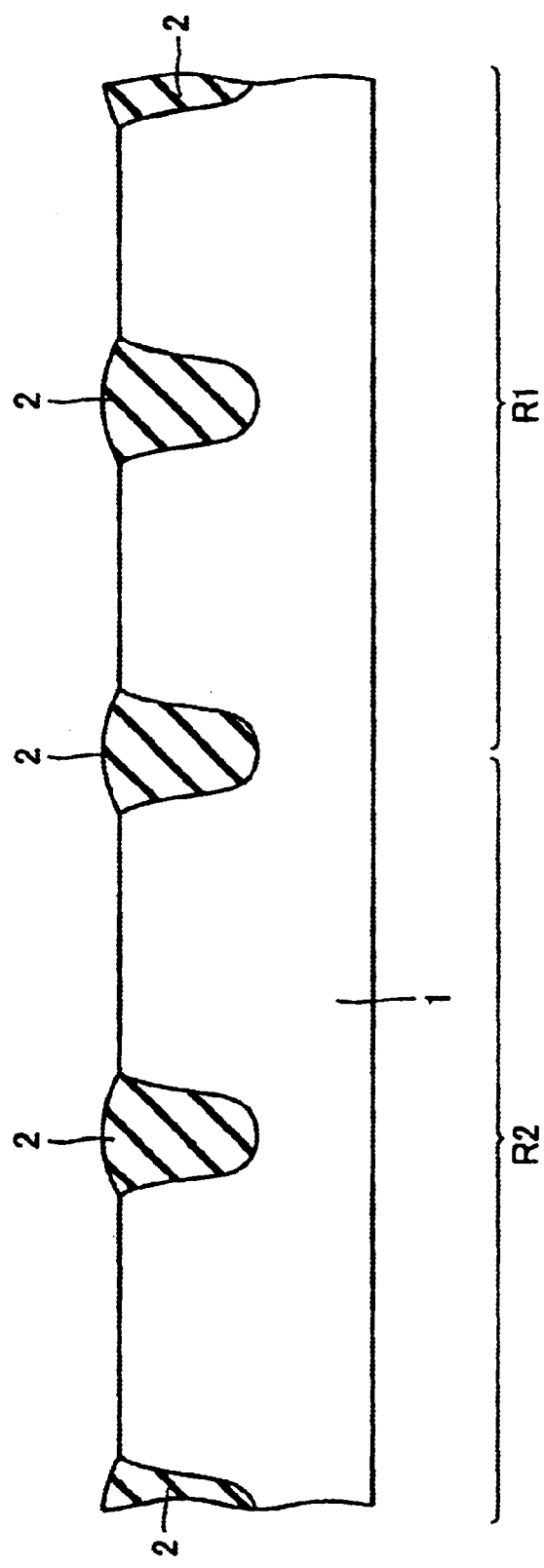
FIG. 4 is a sectional view showing a stage forming an element isolation film on a silicon substrate for fabricating the nonvolatile semiconductor memory device shown in FIG. 1.
Figure 5:
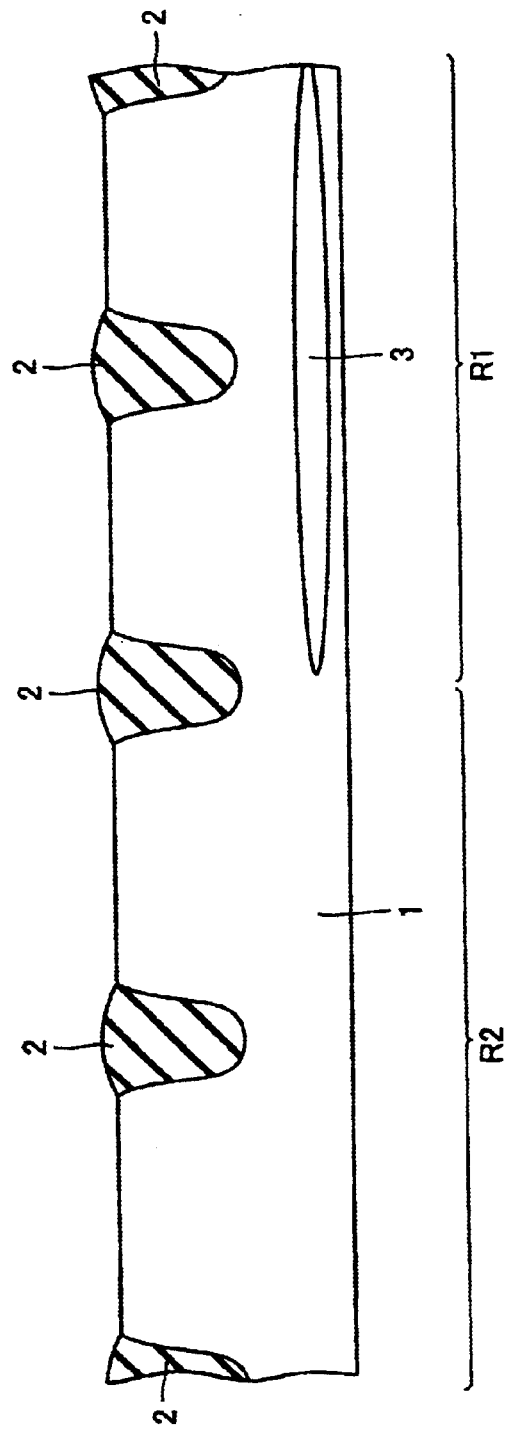
FIG. 5 is a sectional view showing a stage forming a bottom well on the bottom of a memory cell part.

A method of fabricating the nonvolatile semiconductor memory device shown in FIG. 1 is now described. First, element isolation regions 2 consisting of silicon oxide are formed on the main surface of the p-conductivity type silicon substrate 1 having <100>crystal orientation (FIG. 4). Then, phosphorus is ion-implanted into a region of the main surface of the silicon substrate 1 for forming a memory cell with acceleration energy of 3 MeV and density of 1.0E13, for example, through a resist pattern serving as a mask. Thus, the n-conductivity type bottom well 3 is formed and the resist pattern is removed (FIG. 5).

Figure 6:
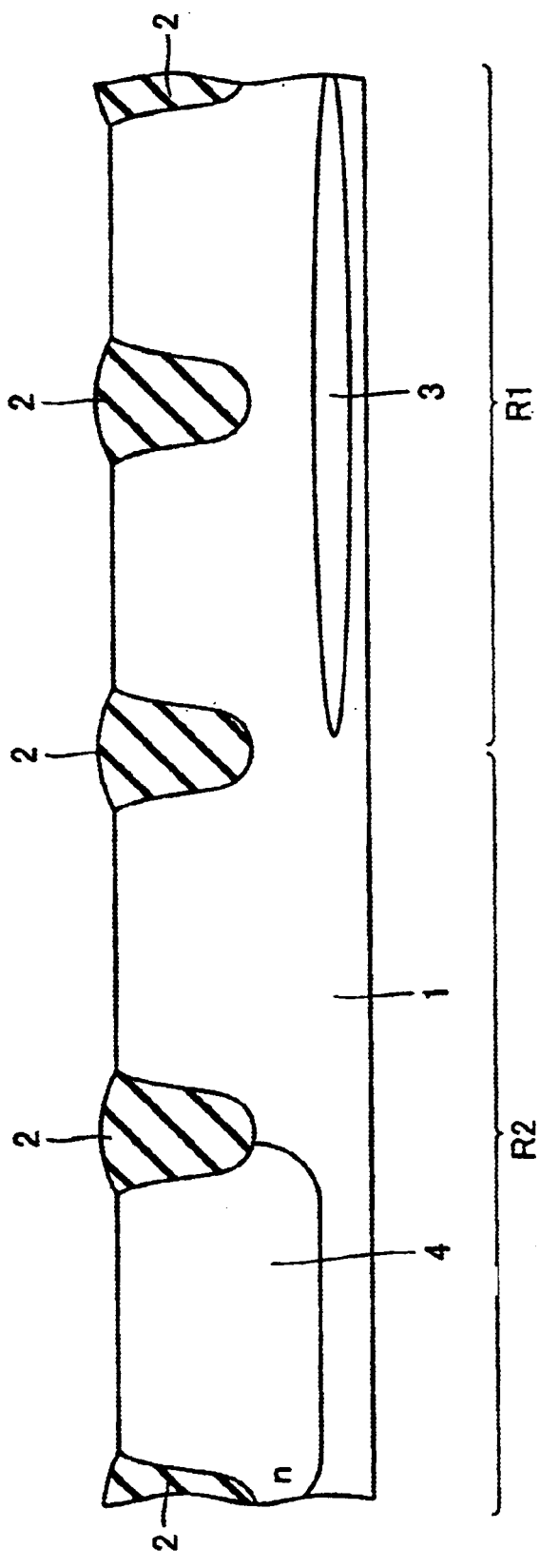
FIG. 6 is a sectional view showing a stage forming an n-conductivity type well in a region of a peripheral circuit part for forming p-conductivity type transistors.

Then, (a) phosphorus is ion-implanted into the region of the peripheral circuit part R2 to be formed with p-conductivity type MOS transistors with acceleration energy of 1.2 MeV and density of 1.0E13, for example, through a resist pattern serving as a mask. Further, (b) phosphorus for channel cutting is ion-implanted into the same region with acceleration energy of 700 keV and density of 3.0E12, for example, and (c) boron for counter doping is ion-implanted into the same region with acceleration energy of 20 keV and density of 1.5E12, for example, respectively. Thus, the n-conductivity type well region 4 is formed by such ion implantation (FIG. 6).

Figure 7:
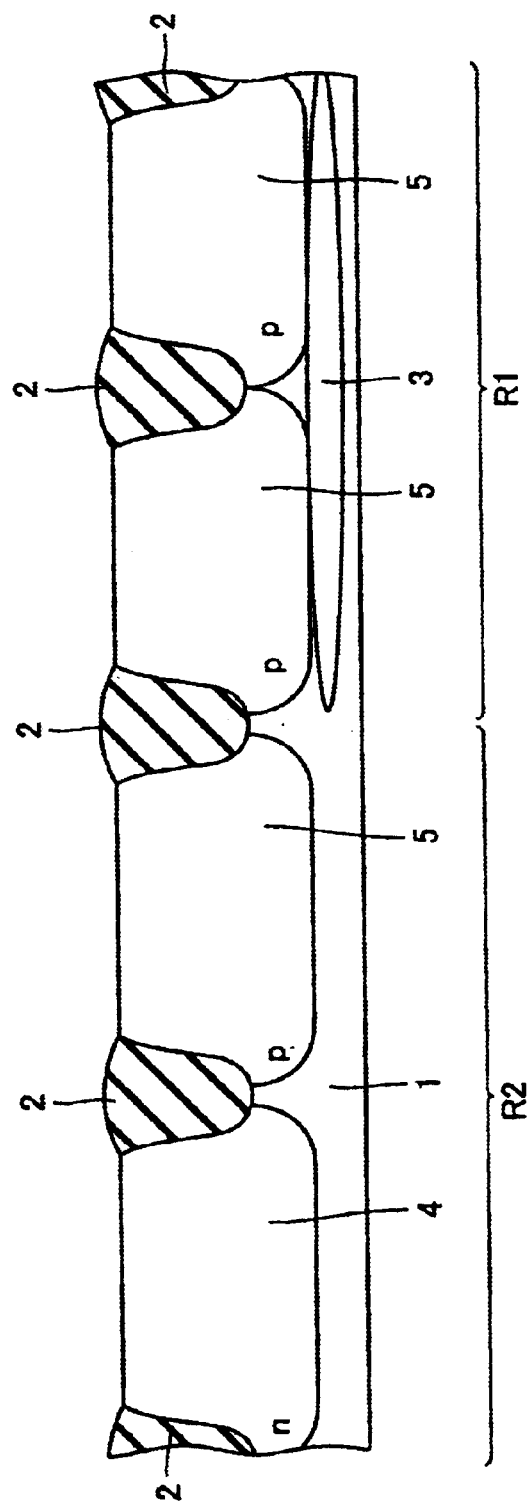
FIG. 7 is a sectional view showing a stage forming p-conductivity type wells in regions of the memory cell part and the peripheral circuit part for forming n-conductivity type transistors.

Thereafter the following ion implantation steps (a), (b) and (c) are carried out on a region of the peripheral circuit part R2 to be formed with n-conductivity type MOS transistors and the region of the memory cell part RI to be formed with the memory transistor 50 through resist patterns serving as masks: (a) Boron is ion-implanted with acceleration energy of 700 keV and density of about 1.0E13, for example. (b) Boron for p-channel cutting is ion-implanted with acceleration energy of 270 keV and density of 3.5E12. (c) Boron for channel doping is ion-implanted with acceleration energy of 50 keV and density of 1.2E12. The p-conductivity type well regions 5 are formed through the aforementioned ion implantation steps (a), (b) and (c) (FIG. 7).

Figure 8:
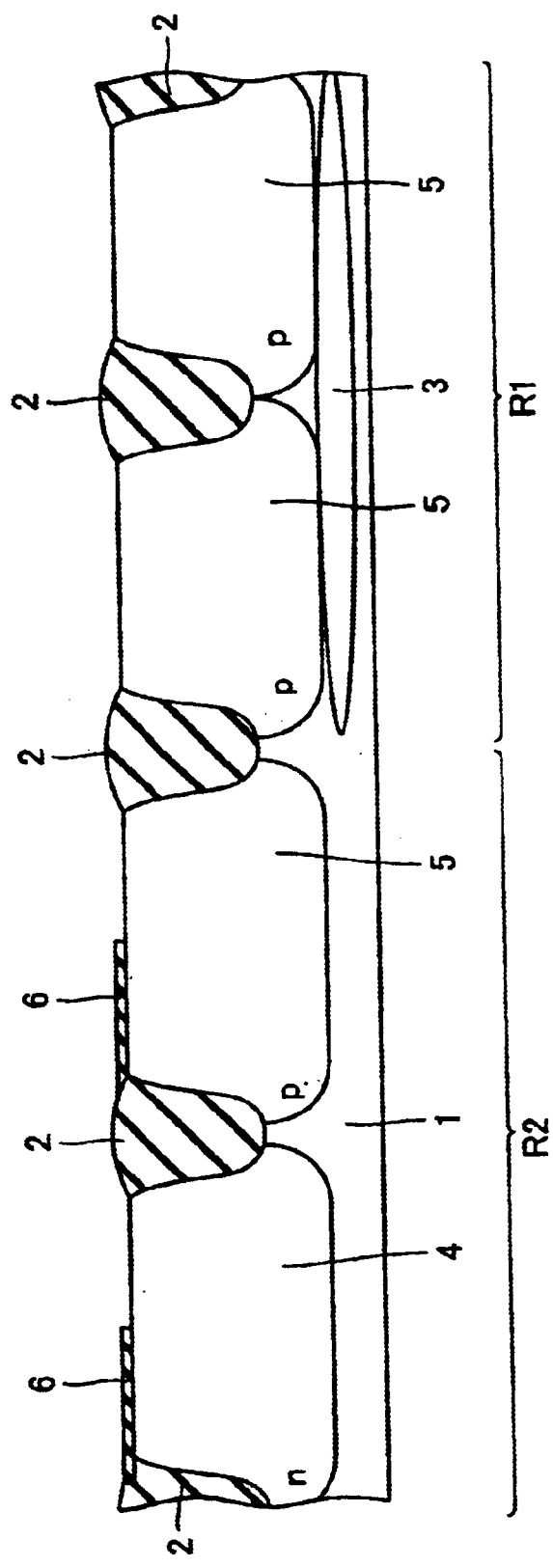
FIG. 8 is a sectional view showing a stage forming lower oxide films of gate oxide films in regions of the peripheral circuit part for forming high withstand voltage transistors.

A silicon oxide film 6 of about 20 nm in thickness is formed on the main surface of the silicon substrate 1 by thermal oxidation. Then, a resist pattern is formed on the silicon oxide film 6 by photolithography, and employed as a mask for removing parts of the silicon oxide film 6 located on the region to be formed with the memory cell transistor 50 and the regions of the peripheral circuit part R2 to be formed with the low withstand voltage transistors 61 by etching. Therefore, the silicon oxide films 6 of about 20 nm in thickness are arranged only on the regions of the peripheral circuit part R2 to be formed with the high withstand transistors 62, as shown in FIG. 8.

Figure 9:
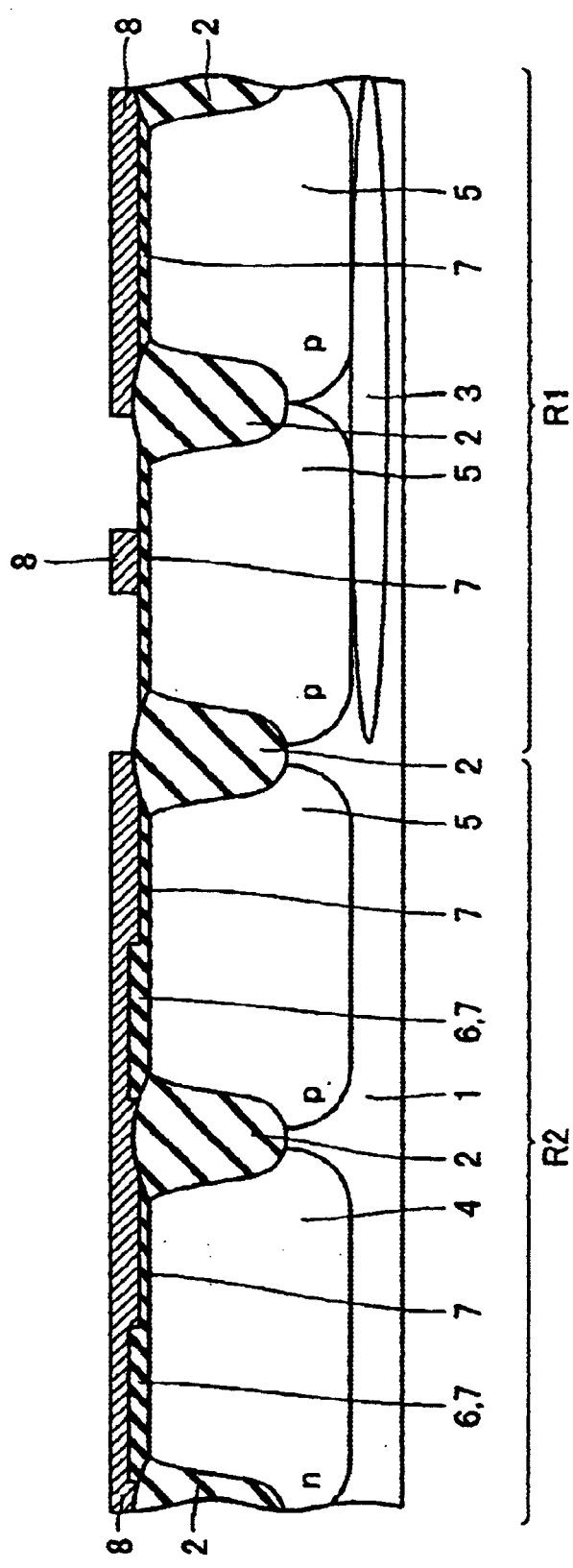
FIG. 9 is a sectional view showing a stage forming a gate oxide film to cover the lower oxide films and the silicon substrate, then forming a conductive layer for defining floating gates over the memory cell part and the peripheral circuit part and patterning the same in the memory cell part.

Then, the silicon oxide films 7 of 10 nm in thickness are formed on the aforementioned silicon oxide films 6 and the main surface of the silicon substrate 1 by thermal oxidation. Then, the phosphorus-doped polycrystailine silicon films 8 of about 200 nm in thickness are formed on the silicon oxide films 7. At this time, the silicon oxide films 7 formed on the regions of the peripheral circuit part R2 to be formed with the low withstand voltage transistors 61 are at least 20 nm and less than 30 nm in thickness. Then, resist patterns are formed on the phosphorus-doped polycrystalline silicon films 8 by photolithography and employed as masks for patterning the phosphorus-doped polycrystalline silicon films 8 (FIG. 9).

Figure 10:
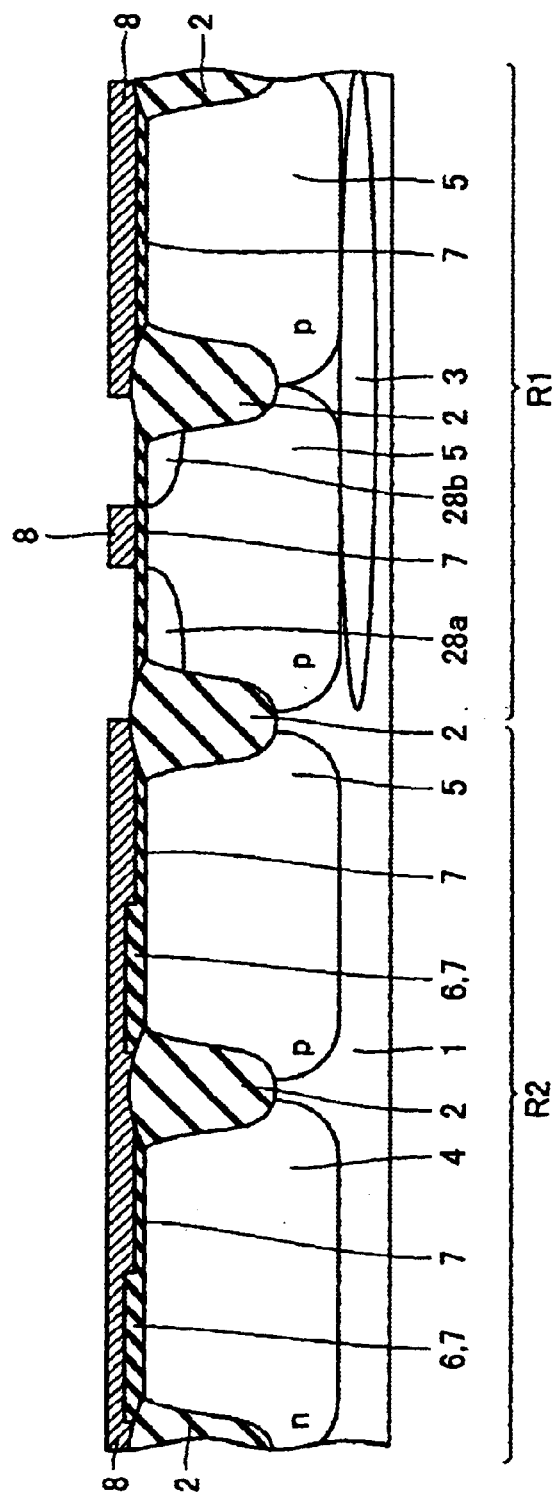
FIG. 10 is a sectional view showing a stage implanting an n-conductivity type impurity into the memory cell part on the silicon substrate for forming source and drain regions of a memory cell transistor.

Arsenic is implanted into the region of the memory cell part R2 to be formed with the memory transistor 50 with acceleration energy of 35 keV and density of 3.0E15, for example, through a resist pattern serving as a mask for forming the n-conductivity type impurity diffusion regions 28a and 28b (FIG. 10).

Figure 11:
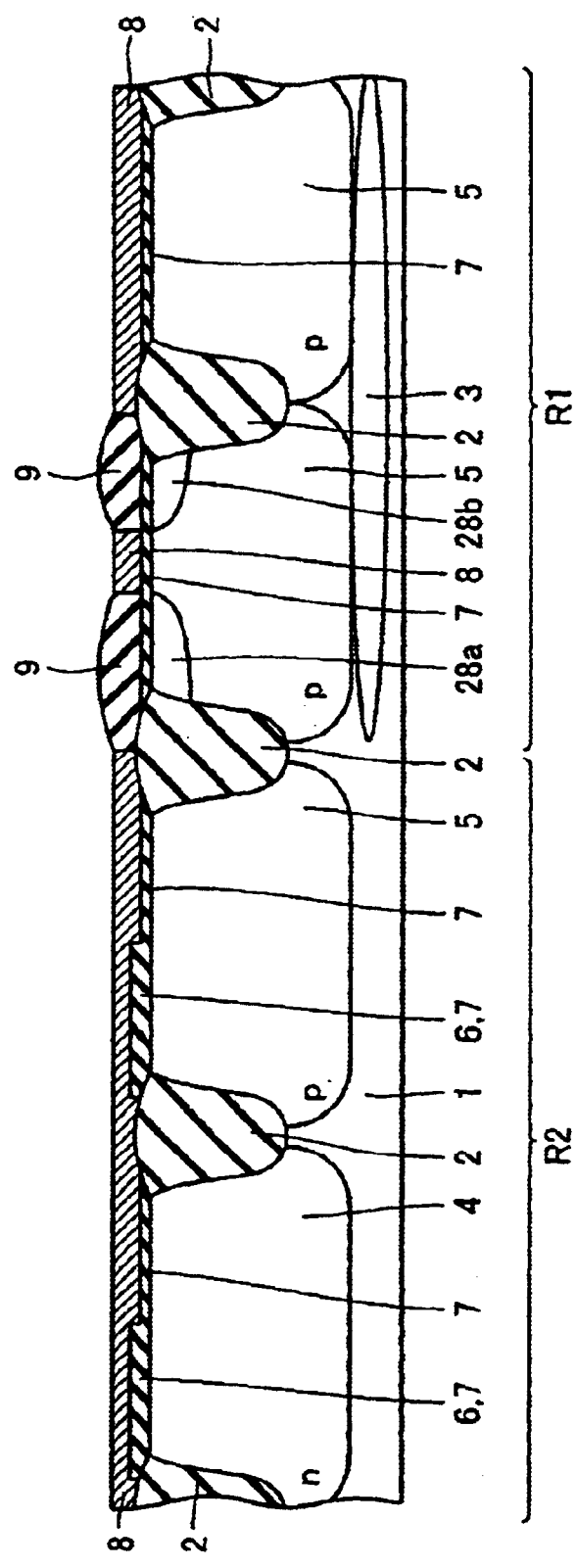
FIG. 11 is a sectional view showing a stage forming a silicon oxide film on the source and drain regions of the memory cell transistor.

Thereafter a silicon oxide film 9 of 800 nm in thickness is deposited on the silicon substrate 1 by low-pressure CVD. Then, the silicon oxide film 9 is subjected to overall etching, thereby exposing the surfaces of the phosphorus-doped polycrystalline silicon films 8 (FIG. 11).

Figure 12:
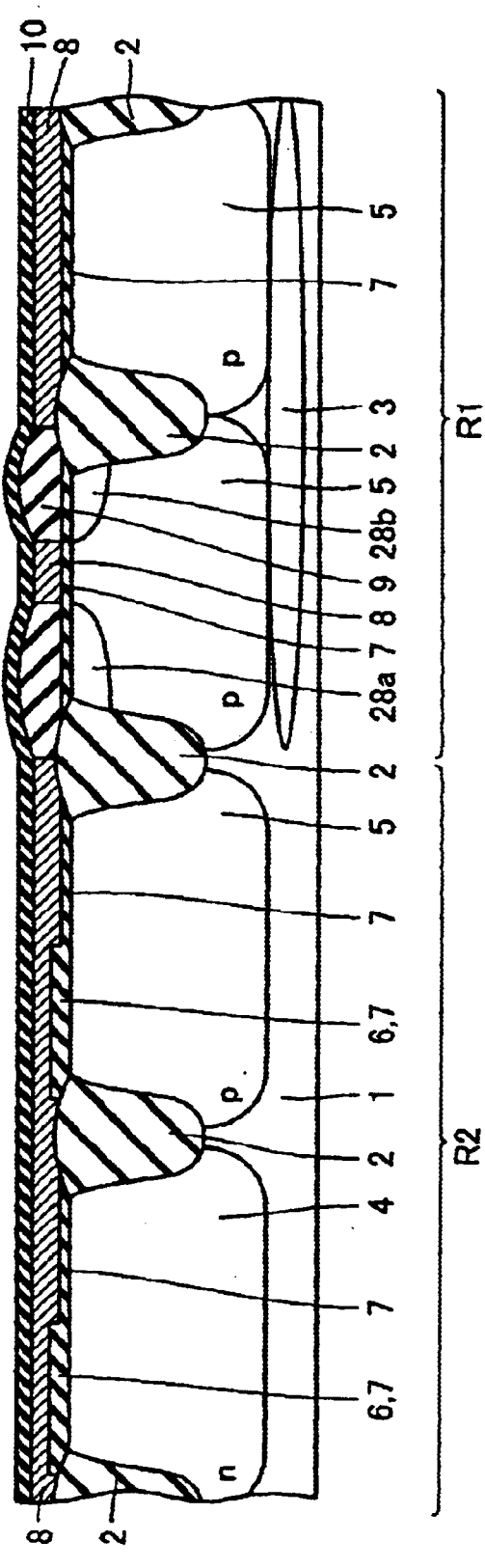
FIG. 12 is a sectional view showing a stage depositing a three-layer insulator film for defining an inter-gate isolation film over the memory cell part and the peripheral circuit part.

Then, a three-layer insulator film 10 is formed on the overall main surface of the silicon substrate 1 by stacking three layers (FIG. 12). In formation of this three-layer insulator film 10, a silicon oxide film of 5 nm in thickness is first formed by thermal oxidation. Then, a silicon nitride film of 10 nm is formed on the silicon oxide film by low-pressure CVD, and another silicon oxide film of 5 nm in thickness is formed on the silicon nitride film by low-pressure CVD.

Figure 13:
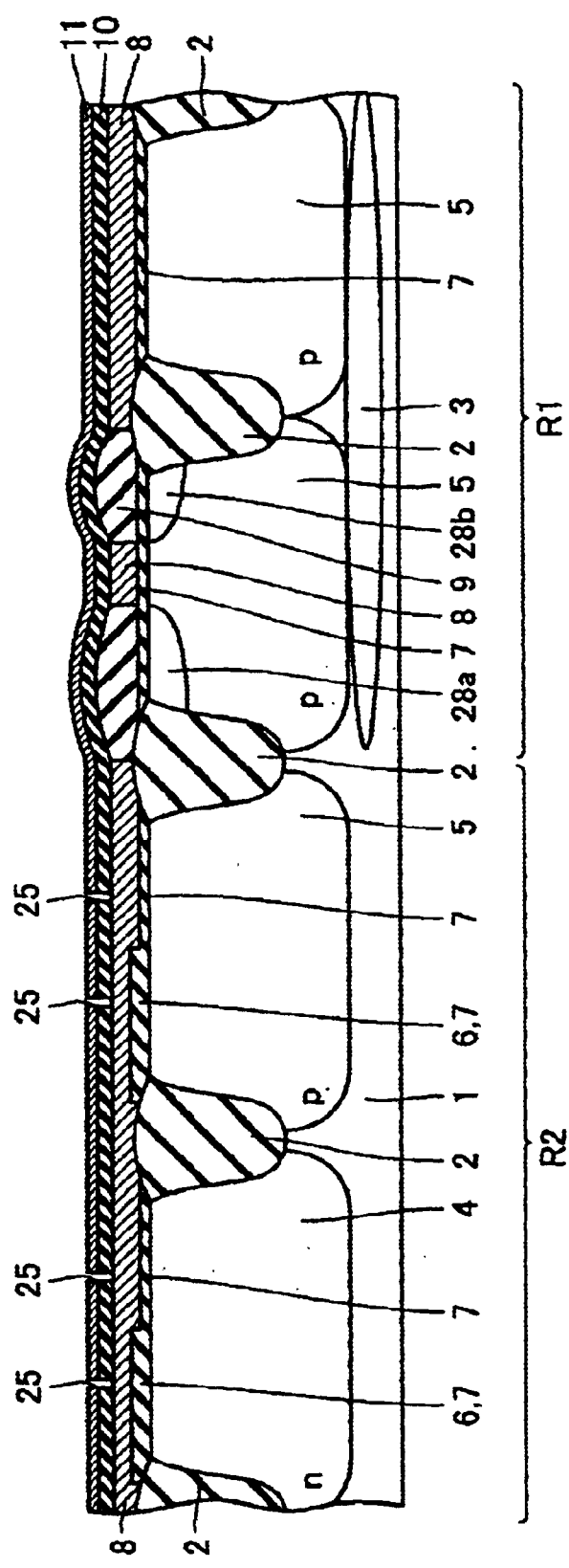
FIG. 13 is a sectional view showing a stage forming a phosphorus-doped polycrystalline silicon film and thereafter opening contact holes through the three-layer insulator film and the phosphorus-doped polycrystalline silicon film on regions formed with the high withstand voltage transistors and low withstand voltage transistors in the peripheral circuit part.

Thereafter the phosphorus-doped polycrystalline silicon film 11 is formed on the three-layer insulator film 10. Then, a resist pattern is formed on the overall main surface of the silicon substrate 1, for patterning the phosphorus-doped polycrystalline silicon film 11 and the three-layer insulator film 10 on the peripheral circuit part R2. Contact holes 25 are opened in the regions of the peripheral circuit part R2 to be formed with the high- and low-withstand voltage transistors due to this patterning, as shown in FIG. 13.

A natural oxide film adhering to the phosphorus-doped polycrystalline silicon film 11 is removed with an HF solution or the like, followed by formation of a phosphorus-doped polycrystalline silicon film 12 of 200 nm in thickness. Then, a WSi film 13 of about 100 nm in thickness is formed on the phosphorus-doped polycrystalline silicon film 12, followed by formation of a silicon oxide film 14 of about 200 nm in thickness. Thereafter a resist pattern is formed by photolithography and employed as a mask for patterning the silicon oxide film 14. Then, the silicon oxide film 14 is employed as a mask for successively patterning the WSi film 13, the phosphorus-doped polycrystailine silicon films 12 and 11, the three-layer insulator film 10 and the phosphorus-doped polycrystalline silicon film 8 (FIG. 14).

Figure 14:
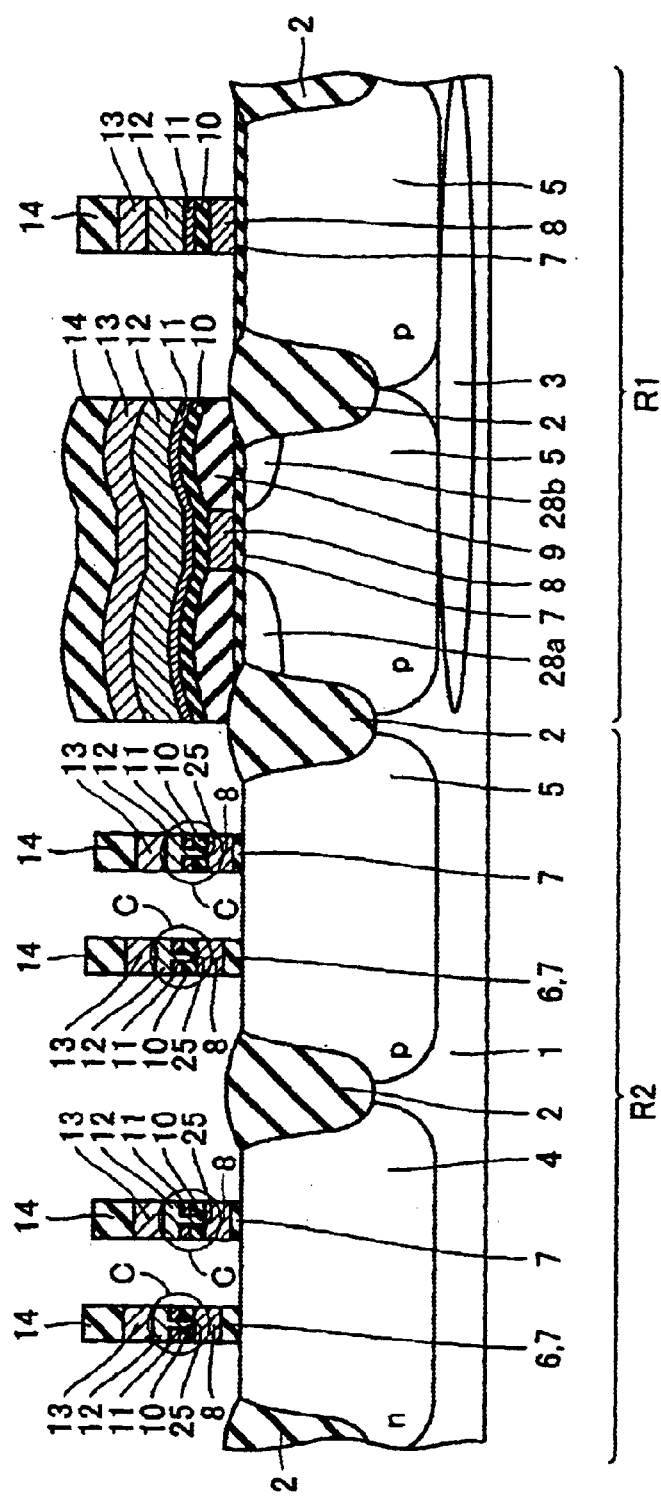
FIG. 14 is a sectional view showing a stage depositing the phosphorus-doped polycrystalline silicon film, then successively stacking a WSi film and an insulator film and thereafter patterning gate portions of the transistors of the memory cell part and the peripheral circuit part.
Figure 15:
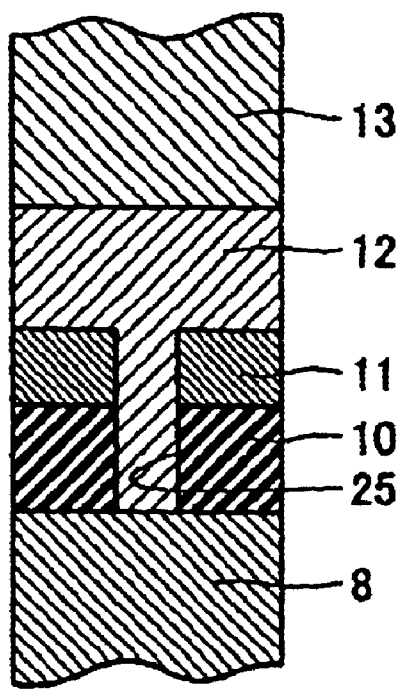
FIG. 15 is an enlarged view of a part C in FIG. 14.

FIG. 15 is an enlarged view of the part C shown in FIG. 14. The phosphorus-doped polycrystalline silicon film 12 of the control gate is electrically connected to the floating gate 8 through the contact hole 25 formed in the three-layer insulator film 10 and the phosphorus-doped polycrystalline silicon film 11.

Figure 16:
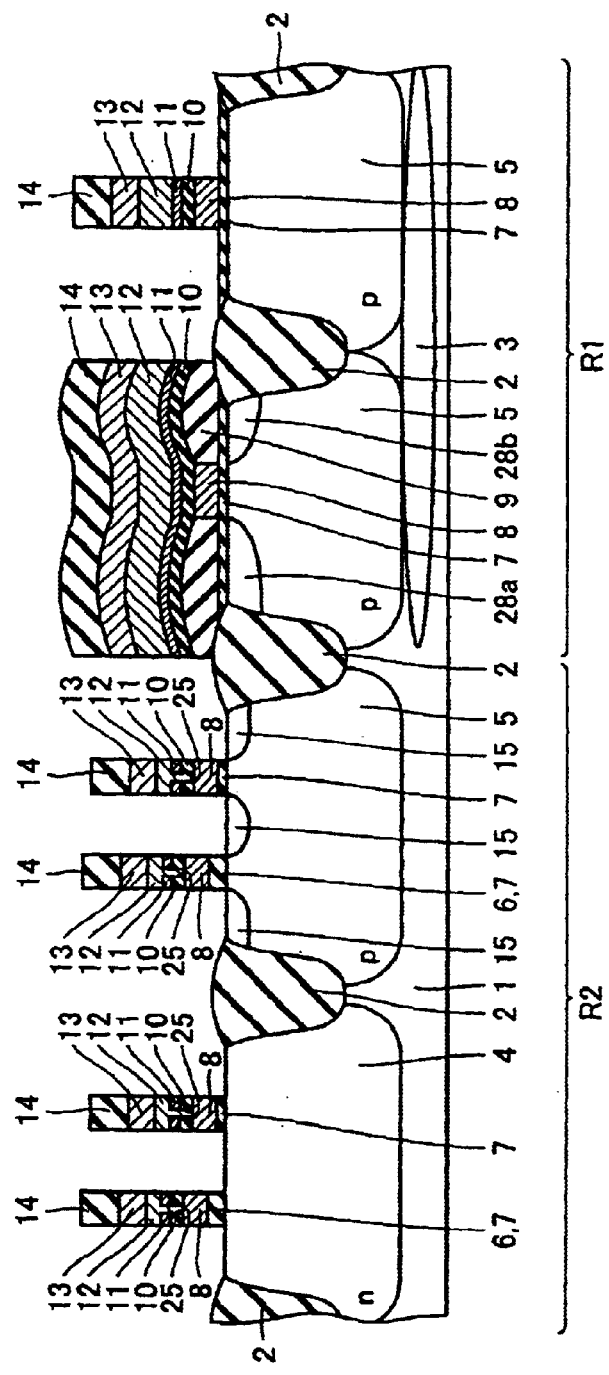
FIG. 16 is a sectional view showing a stage implanting an n-conductivity type impurity into portions of the silicon substrate for forming the n-conductivity type transistors of the peripheral circuit part.
Figure 17:
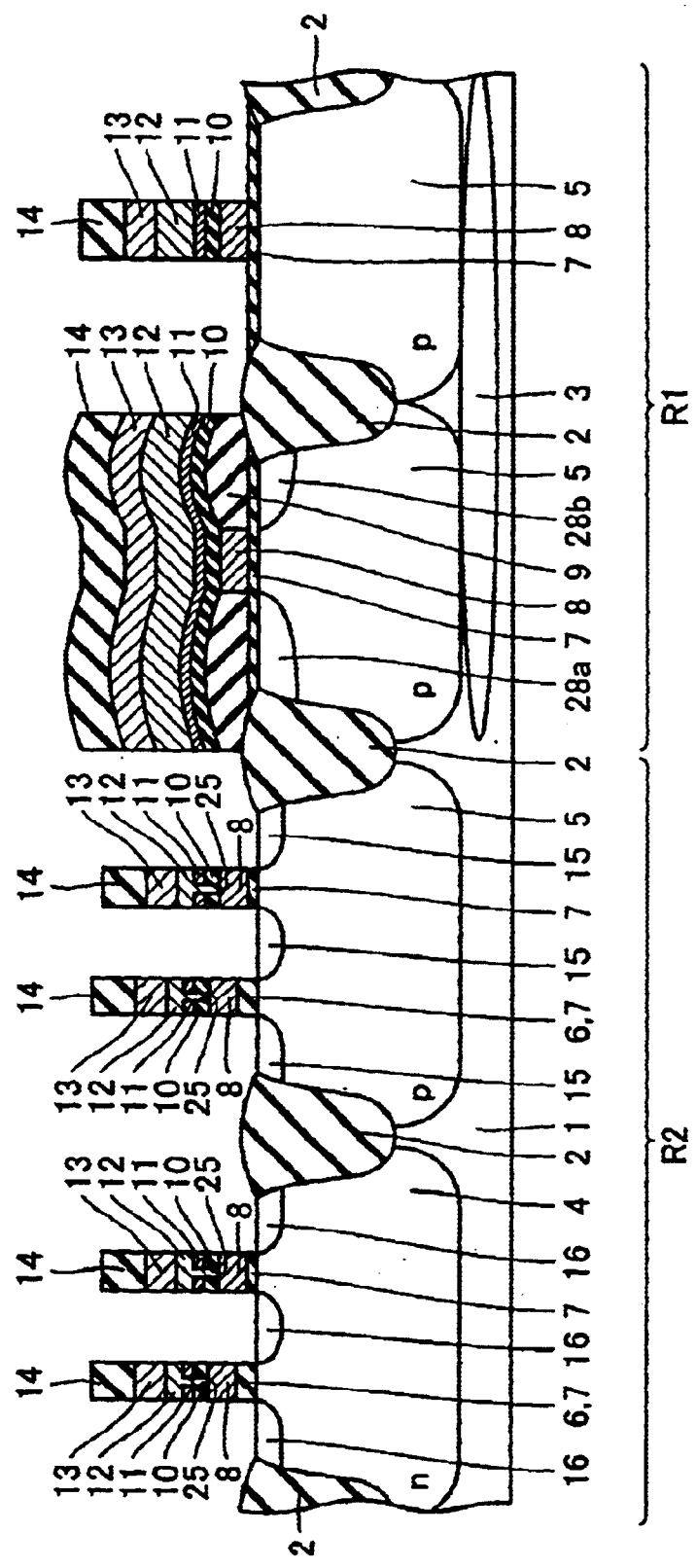
FIG. 17 is a sectional view showing a stage implanting an p-conductivity type impurity into portions of the silicon substrate for forming the p-conductivity type transistors of the peripheral circuit part.

Then, phosphorus is ion-implanted into the region of the peripheral circuit part R2 to be formed with the n-conductivity MOS transistors with acceleration energy of 50 keV and density of about 4.0E13, for example, through a resist pattern serving as a mask, for forming the low-concentration impurity regions 15 of the n-conductivity type MOS transistors (FIG. 16). Then, boron is ion-implanted into the region of the peripheral circuit part R2 to be formed with the p-conductivity type MOS transistors with acceleration energy of 50 keV and density of about 1.5E13, for example, through a resist pattern serving as a mask for forming the low-concentration impurity regions 16 of the p-conductivity type MOS transistors (FIG. 17).

Figure 18:
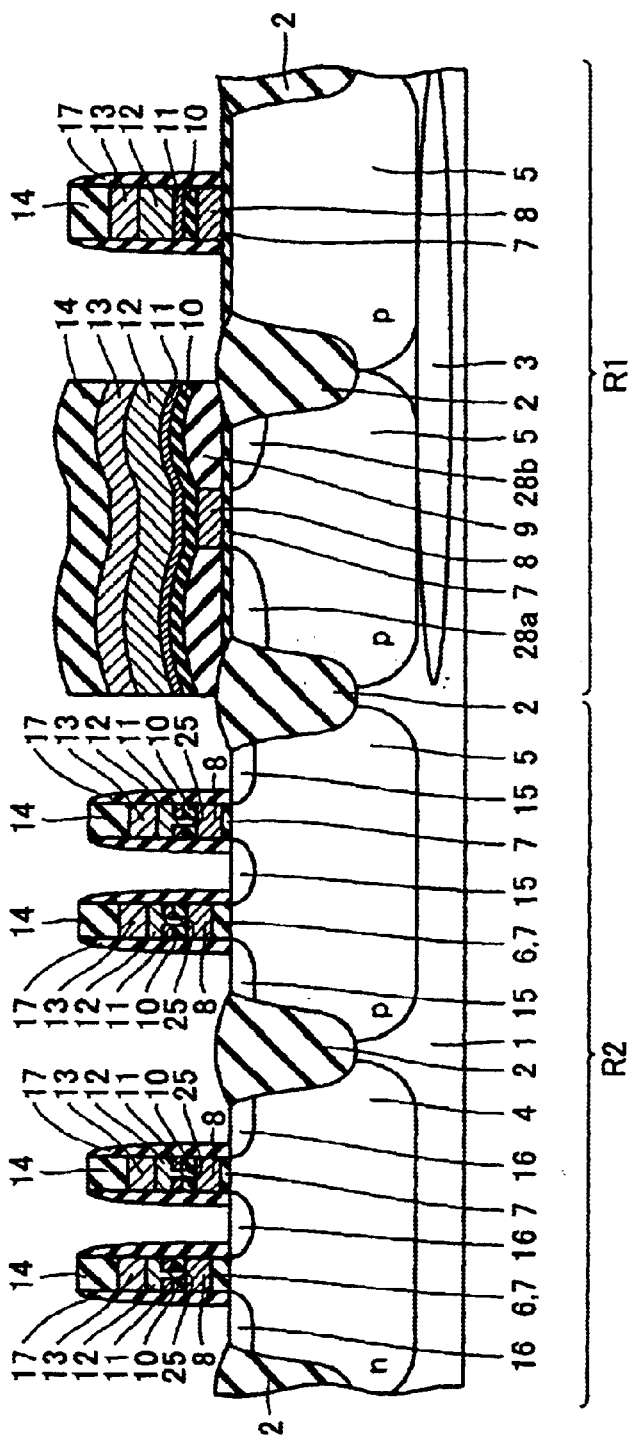
FIG. 18 is a sectional view showing a stage forming side wall spacers on the side surfaces of the gate portions of the memory cell part and the peripheral circuit part.
Figure 19:
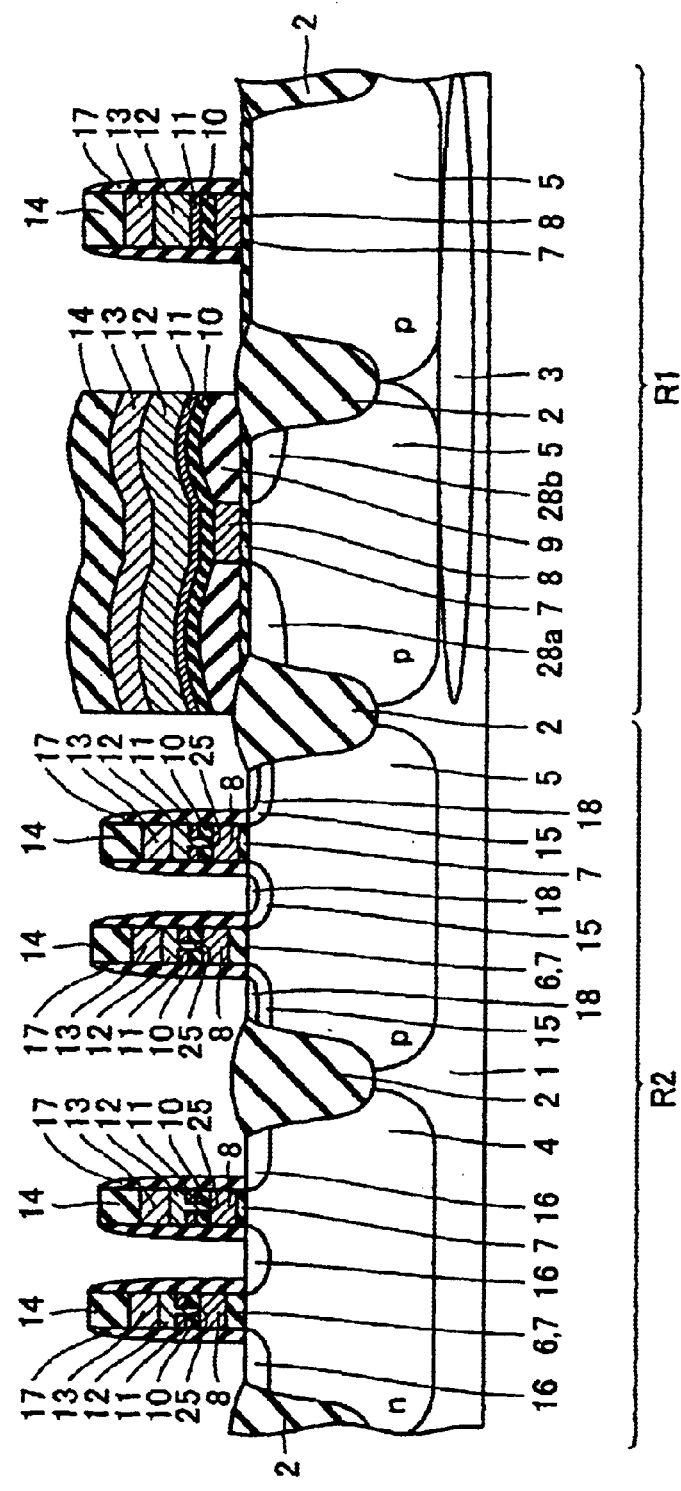
FIG. 19 is a sectional view showing a stage implanting an n-conductivity type impurity into source and drain regions of the n-conductivity type transistors through the side wall spacers serving as masks for forming high-concentration n-conductivity type regions.
Figure 20:
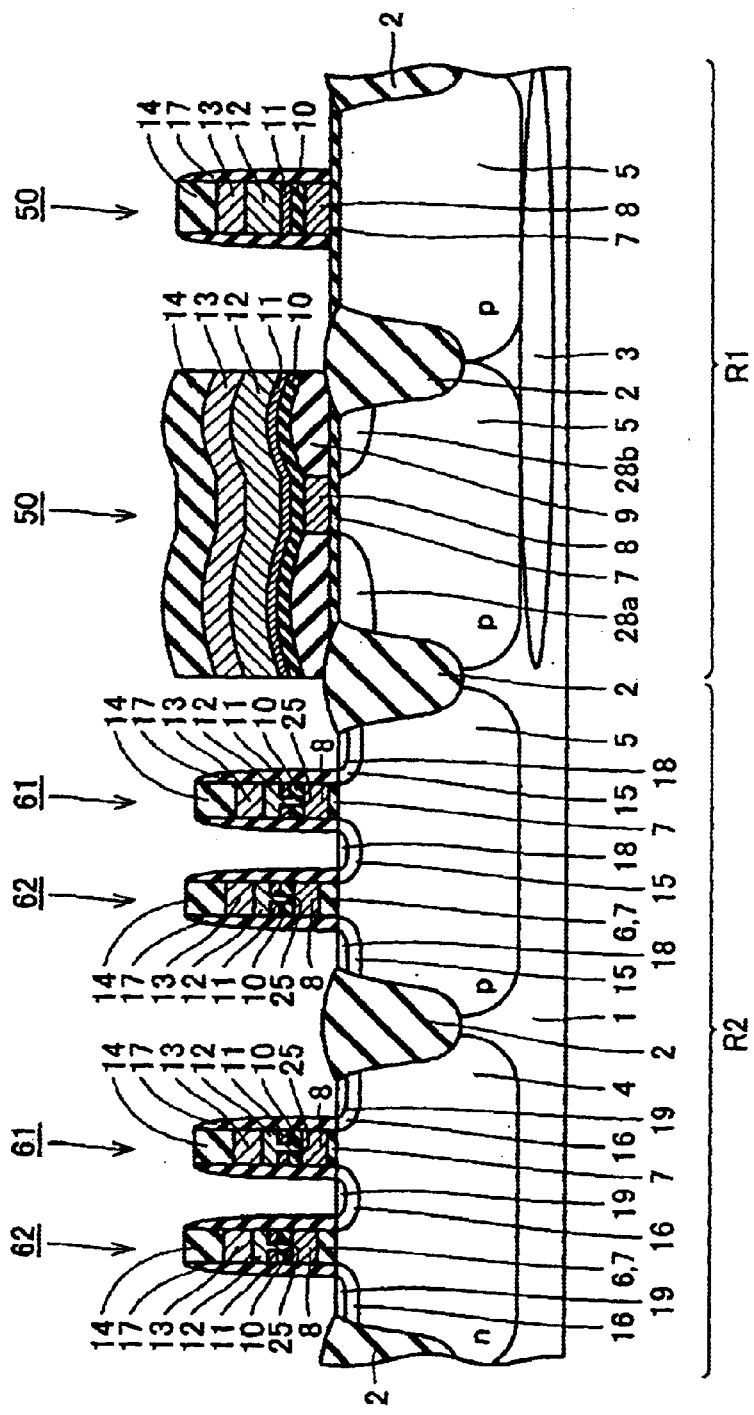
FIG. 20 is a sectional view showing a stage implanting a p-conductivity type impurity into source and drain regions of the p-conductivity type transistors through the side wall spacers serving as masks for forming high-concentration p-conductivity type regions.
Figure 21:
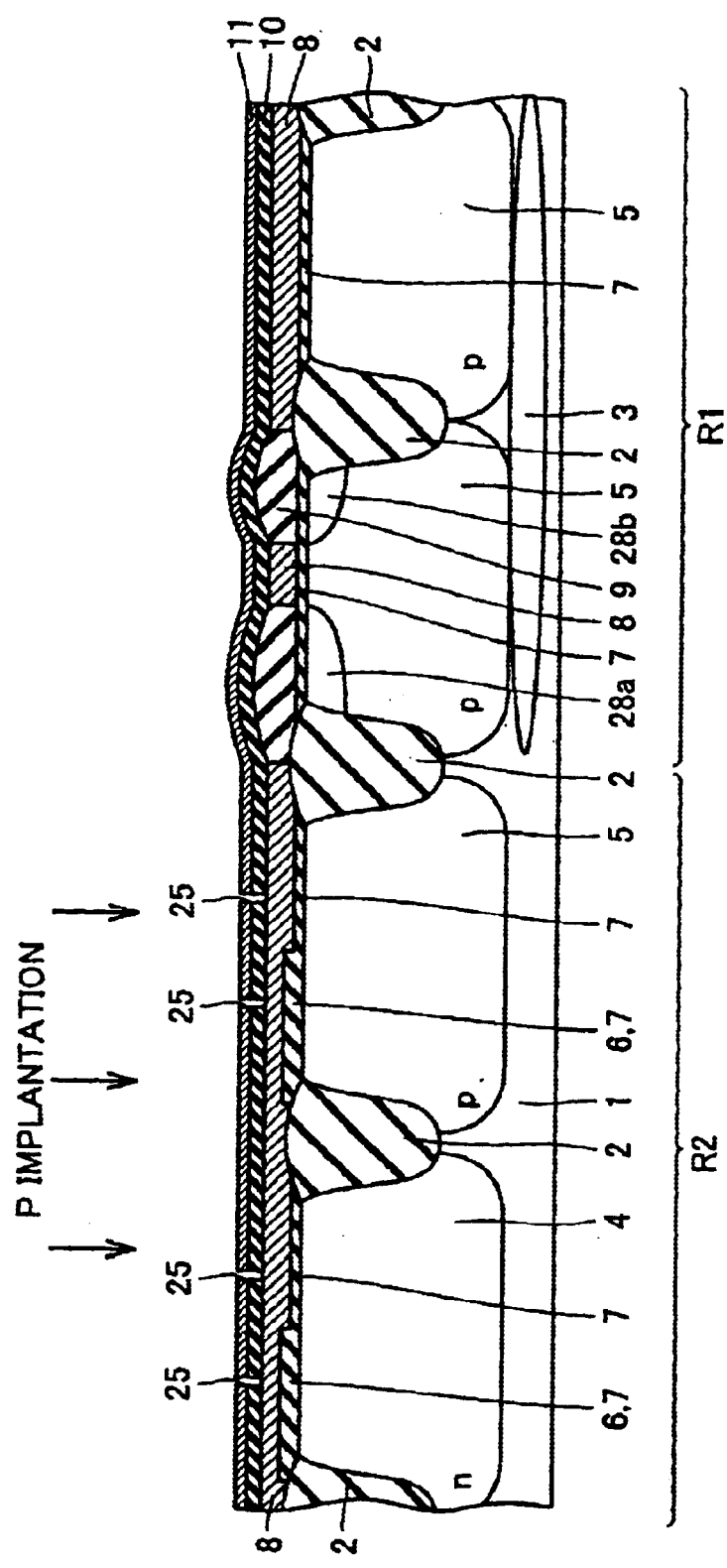
FIG. 21 is a sectional view showing a stage opening contact holes in a three-layer insulator film and a phosphorus-doped polycrystalline silicon film and thereafter further implanting phosphorus into a floating gate conductive layer of a peripheral circuit part in fabrication of a nonvolatile semiconductor memory device according to a second embodiment of the present invention.

Thereafter a silicon oxide film is formed by CVD, and the side wall spacers 17 are formed by anisotropically etching the silicon oxide film (FIG. 18). Then, arsenic is ion-implanted into the region of the peripheral circuit part R2 to be formed with the n-conductivity type MOS transistors with acceleration energy of 35 keV and density of about 4.0E15, for example, through a resist pattern serving as a mask, for forming the high-concentration impurity regions 18 of the n-conductivity type MOS transistors (FIG. 19). Then, $BF_2$ is ion-implanted into the region of the peripheral circuit part R2 to be formed with the p-conductivity type MOS transistors with acceleration energy of 20 keV and density of about 2.0E15, for example, through a resist pattern serving as a mask, for forming the high-density impurity regions 19 of the p-conductivity type MOS transistors (FIG. 20).

The aforementioned nonvolatile semiconductor memory device renders the floating gate (FG) 8 and the control gate (CG) 12, isolated by the inter-gate isolation film consisting of the three-layer insulator film 10 in the memory cell part R1, conductive in the peripheral circuit part R2 as general gate electrodes. Therefore, the gate insulator films 7 of the nonvolatile transistor 50 of the memory cell part R1 and the low withstand voltage transistors 61 of the peripheral circuit part R2 can be fabricated at the same time. Further, the gate portions of the nonvolatile transistor 50 of the memory cell part R1 and the transistors 61 and 62 of the peripheral circuit part R2 can be fabricated in parallel at the same time. Consequently, the number of processing steps can be reduced for inhibiting the semiconductor substrate 1 from crystal defects resulting from thermal oxidation. Further, the impurity regions can be suppressed from enlargement by reducing the time of heat treatment applied to the memory cell part R1, not to inhibit refinement of the memory cell part R1.

Further, the thin phosphorus-doped polycrystalline silicon films 11 are deposited on the three-layer insulator films 10 so that natural oxide films adhering to the phosphorus-doped polycrystalline silicon films 11 can be removed with an HF solution, for example, after opening the contact holes 25 through the phosphorus-doped polycrystalline silicon films 11 and the three-layer insulator films 10. Therefore, floating conductive layers and control conductive layers can be reliably rendered conductive in the peripheral circuit part R2.

Second Embodiment

A nonvolatile semiconductor memory device according to a second embodiment of the present invention is identical in structure to the nonvolatile semiconductor memory device shown in FIG. 1. The feature of the nonvolatile semiconductor memory device according to the second embodiment resides in that the phosphorus concentration of a phosphorus-doped polycrystalline silicon film 8 in a peripheral circuit part R2 is higher than that in the first embodiment.

A method of fabricating the nonvolatile semiconductor memory device according to the second embodiment is basically identical to the fabrication method according to the first embodiment. Steps similar to those shown in FIGS. 1 to 13 with reference to the first embodiment are employed as such. After contact holes 25 are formed in a three-layer insulator film 10 and a phosphorus-doped polycrystalline silicon film 11 as shown in FIG. 13, phosphorus is ion-implanted into the peripheral circuit part R2 through a resist pattern serving as a mask. Therefore, the phosphorus-doped polycrystalline silicon film 8 of the peripheral circuit part R2 has higher phosphorus concentration than a phosphorus-doped silicon film 8 for defining a floating gate in a memory cell part R1. Subsequent fabrication steps are identical to those shown in FIGS. 14 to 20 with reference to the first embodiment.

The aforementioned nonvolatile semiconductor memory device according to the second embodiment has the following function/effect, in addition to the function/effect of the nonvolatile semiconductor memory device according to the first embodiment: In general, the impurity concentration of the phosphorus-doped polycrystalline silicon film 11 is decided in response to the characteristics of a memory cell transistor 50 of the memory cell part R1 and set to about $4E20/cm^3$, for example. In the peripheral circuit part R2, however, the phosphorus-doped polycrystalline silicon films 11 for defining gate electrodes of transistors preferably have higher concentration than that in the memory cell part R1, in order to suppress depletion of the gate materials. According to this embodiment, only a single ion implantation step may be added to the processing steps according to the first embodiment. Consequently, gate materials different in impurity concentration from each other can be obtained for the transistors of the memory cell part R1 and the peripheral circuit part R2 through simple steps.

The aforementioned nonvolatile semiconductor memory device can be fabricated as follows: First, the nonvolatile semiconductor memory device is fabricated along a procedure identical to that shown in FIGS. 1 to 10 with reference to the first embodiment. Referring to FIG. 10, a phosphorus-doped polycrystalline silicon film 11 is formed on a three-layer insulator film 10, and through holes reaching the phosphorus-doped polycrystalline silicon films 8 are formed on transistor forming regions of the peripheral circuit part R2.

According to this embodiment, phosphorus is thereafter implanted into only the peripheral circuit part R2 excluding the memory cell part R1, as shown in FIG. 19. The phosphorus-doped polycrystalline silicon films 8 of the peripheral circuit part R2 exhibit higher phosphorus concentration than that in the memory cell part R1 due to this implantation of phosphorus into the peripheral circuit part R2.

Subsequent fabrication steps are carried out along the processing steps shown in FIGS. 11 to 18 with reference to the first embodiment.

The aforementioned nonvolatile semiconductor memory device can attain the following advantage, in addition to that obtained in the nonvolatile semiconductor memory device according to the first embodiment:

In general, the impurity concentration of the phosphorus-doped polycrystalline silicon films 11 is decided in response to the characteristics of the memory cell transistor 50 of the memory cell part R1 and set to about $4E20/cm^2$, for example. In the peripheral circuit part R2, however, the phosphorus-doped polycrystalline silicon films 11 for defining gate electrodes of the transistors preferably have higher concentration than that in the memory cell part R1, in order to suppress depletion of the gate materials. According to this embodiment, only a single ion implantation step may be added to the processing steps according to the first embodiment for changing the impurity concentration values of the gate electrodes in the memory cell part R1 and the peripheral circuit part R2.

Third Embodiment

Figure 22:
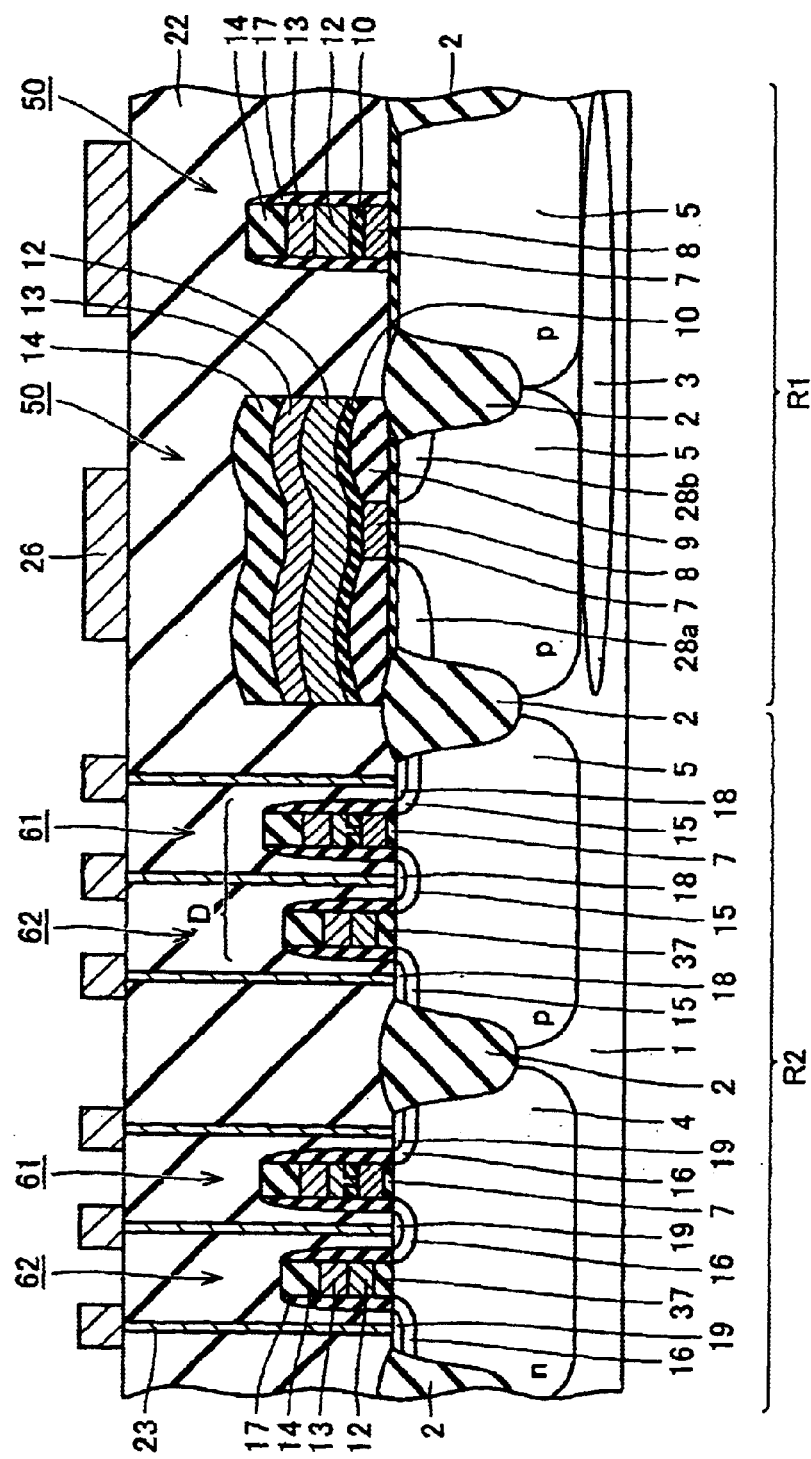
FIG. 22 is a sectional view of a nonvolatile semiconductor memory device according to a third embodiment of the present invention.
Figure 23:
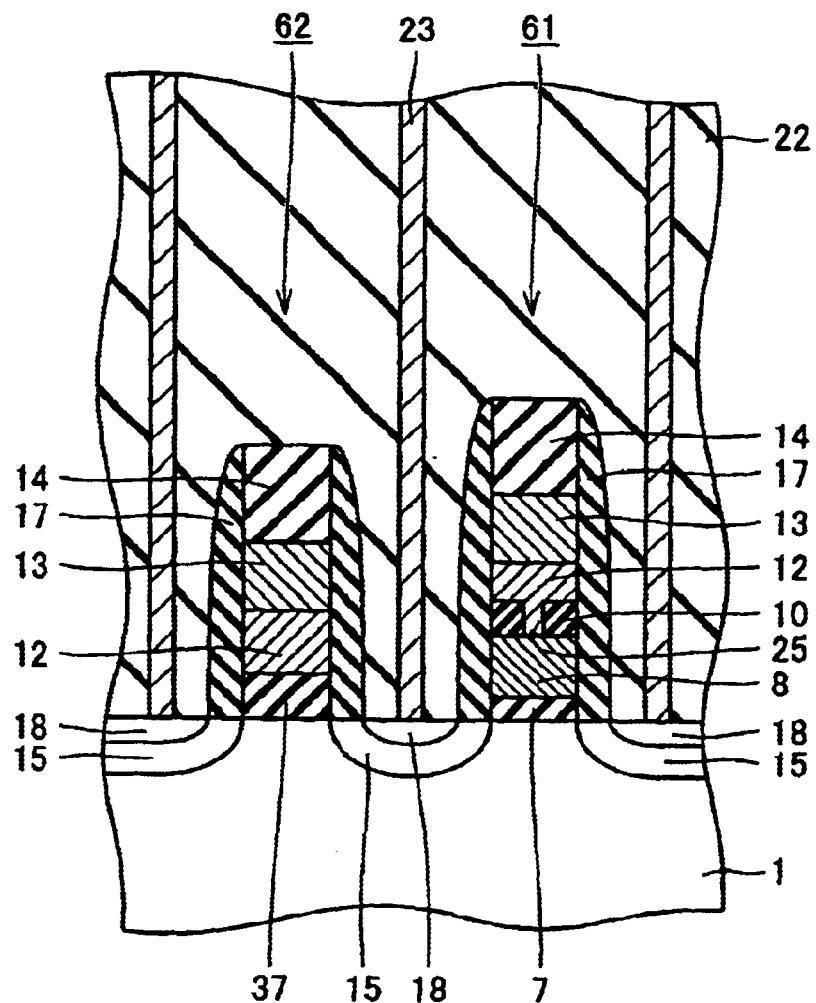
FIG. 23 is an enlarged view of a part D in FIG. 22.

Referring to FIG. 22, high withstand voltage transistors 62 and low withstand voltage transistors 61 in a peripheral circuit part R2 are different from each other not only in the thicknesses of gate insulator films but also in multilayer structures in a nonvolatile semiconductor memory device according to a third embodiment of the present invention. FIG. 23 is an enlarged view of a part D of the peripheral circuit part R2 shown in FIG. 22. Referring to FIG. 23, a gate insulator film 37 of the high withstand voltage transistor 62 is formed by a single layer having a larger thickness than a gate insulator film 7 of the low withstand voltage transistor 61.

A gate portion of the low withstand voltage transistor 61 has the same multilayer structure as that of a memory transistor. However, a contact hole 25 is opened in an inter-gate isolation film 10 and filled up with a conductive layer of a control gate 12, which is electrically connected with a floating gate 8. The floating gate layer 8 is formed on a gate oxide film 7 while the control gate layer 12, a WSi layer 13 and an insulator film 14 are arranged thereon similarly to the memory transistor except the conducting part.

In the high withstand voltage transistor 62, on the other hand, a control gate layer 12, a WSi layer 13 and an insulator film 14 are arranged on a gate oxide films 37. The high withstand voltage transistor 62 includes no inter-gate isolation film.

A method of fabricating the nonvolatile semiconductor memory device according to the third embodiment shown in FIG. 22 is now described. First, element isolation regions 2 consisting of silicon oxide are formed on the main surface of a p-conductivity type silicon substrate 1 having <100>crystal orientation (refer to FIG. 4). Then, phosphorus is ion-implanted into a region of the main surface of the silicon substrate 1 for forming a memory cell with acceleration energy of 3 MeV and density of 1.0E13, for example, through a resist pattern serving as a mask, for forming a n-conductivity type bottom well 3 (refer to FIG. 5).

Then, (a) phosphorus is ion-implanted into a region of the peripheral circuit part R2 to be formed with p-conductivity type MOS transistors with acceleration energy of 1.2 MeV and density of 1.0E13, for example, through a resist pattern serving as a mask. Further, (b) phosphorus for channel cutting is ion-implanted into the same region with acceleration energy of 700 keV and density of 3.0E12, for example, and (b) boron for counter doping is ion-implanted into the same region with acceleration energy of 20 keV and density of 1.5E12 respectively. Thus, an n-conductivity type well region 4 is formed by such ion implantation (refer to FIG. 6).

Thereafter (a) boron is ion-implanted into a region of the peripheral circuit part R2 to be formed with n-conductivity type MOS transistors and the region of the memory cell part R1 to be formed with the memory transistor with acceleration energy of 700 keV and density of about 1.0E13, for example, through a resist pattern serving as a mask. (b) Boron for p-channel cutting is ion-implanted with acceleration energy of 270 keV and density of 3.5E12. Further, (c) boron for channel doping is ion-implanted with acceleration energy of 50 keV and density of 1.2E12. P-conductivity type well regions 5 are formed through the aforementioned ion implantation steps (a), (b) and (c) (refer to FIG. 7).

Figure 24:
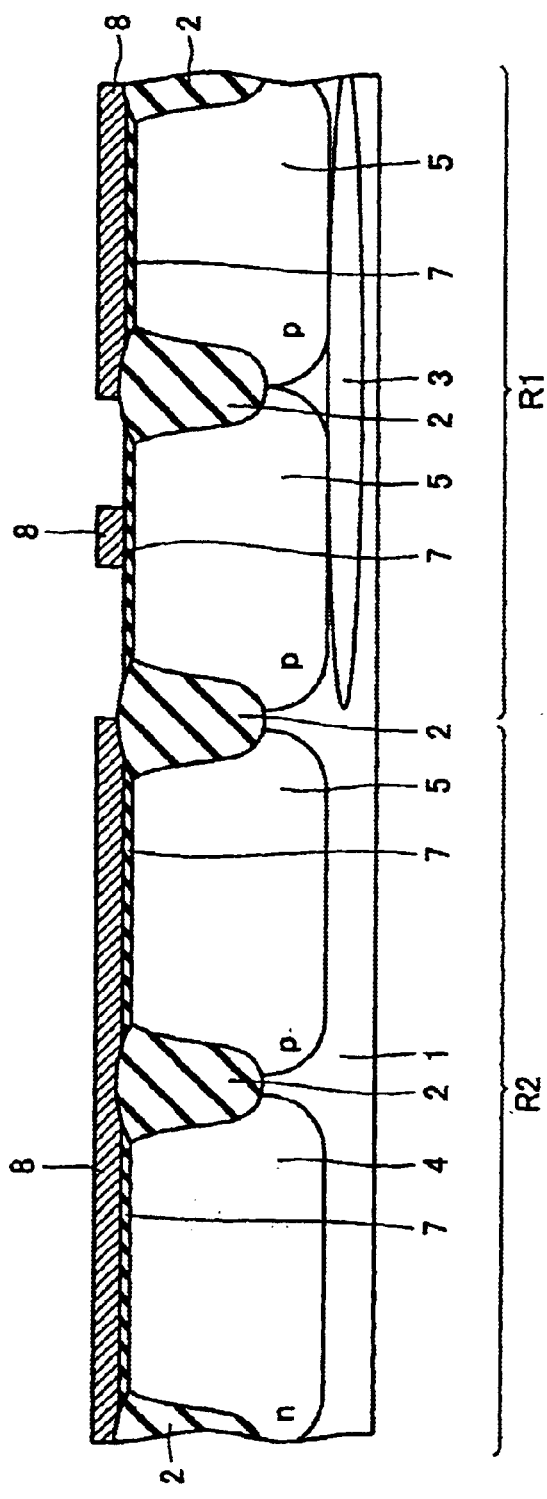
FIG. 24 is a sectional view showing a stage forming a gate insulator film on a silicon substrate, thereafter depositing a conductive layer for defining a floating gate and patterning the same in fabrication of the nonvolatile semiconductor memory device shown in FIG. 22.

Then, a silicon oxide film 7 of 10 nm in thickness is formed on the main surface of the silicon substrate 1 by thermal oxidation. Then, a phosphorus-doped polycrystalline silicon film 8 of about 200 nm in thickness is formed on the silicon oxide film 7. Then, a resist pattern is formed on the phosphorus-doped polycrystalline silicon film 8 by photolithography for patterning the phosphorus-doped polycrystalline silicon film 8 through the resist pattern serving as a mask (FIG. 24).

Figure 25:
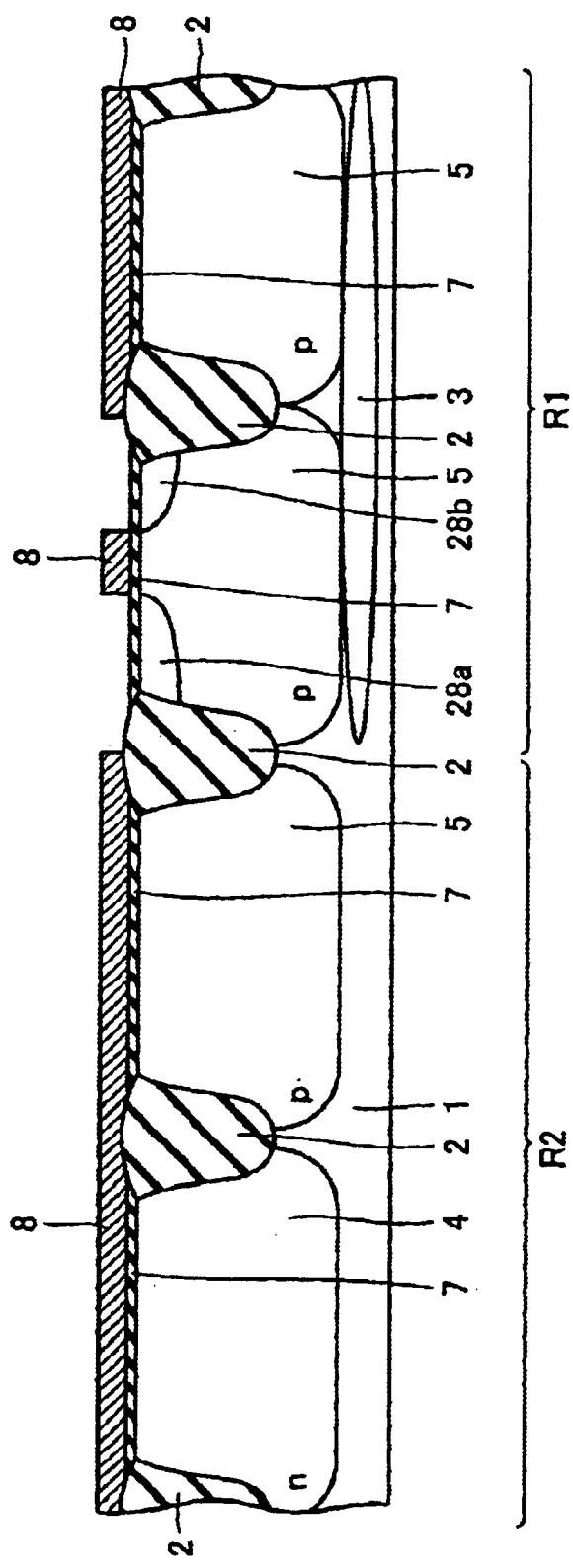
FIG. 25 is a sectional view showing a stage forming n-conductivity type impurity regions for defining source and drain regions of a memory transistor.

Arsenic is implanted into the region of the memory cell part R1 to be formed with the memory transistor with acceleration energy of 35 keV and density of 3.0E15, for example, through a resist pattern serving as a mask for forming n-conductivity type impurity regions 28a and 28b (FIG. 25).

Figure 26:
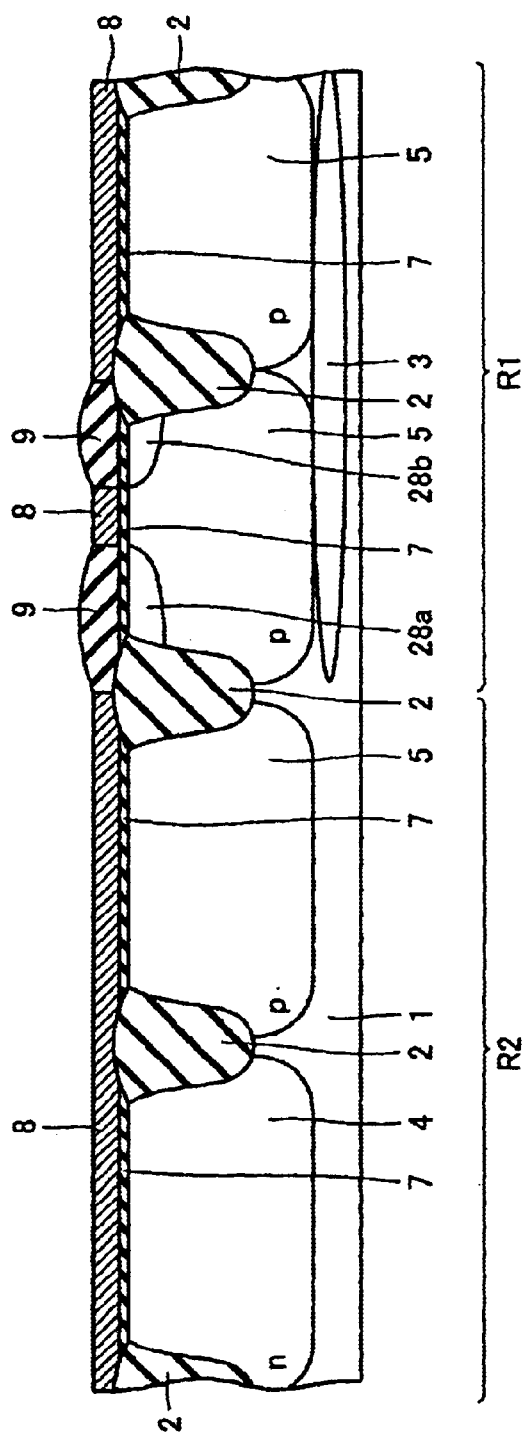
FIG. 26 is a sectional view showing a stage forming a silicon oxide film on the source and drain regions of the memory transistor.

Thereafter a silicon oxide film 9 of 800 nm in thickness is deposited on the silicon substrate 1 by low-pressure CVD and subjected to overall etching, thereby exposing the surfaces of the phosphorus-doped polycrystalline silicon films 8 (FIG. 26).

Figure 27:
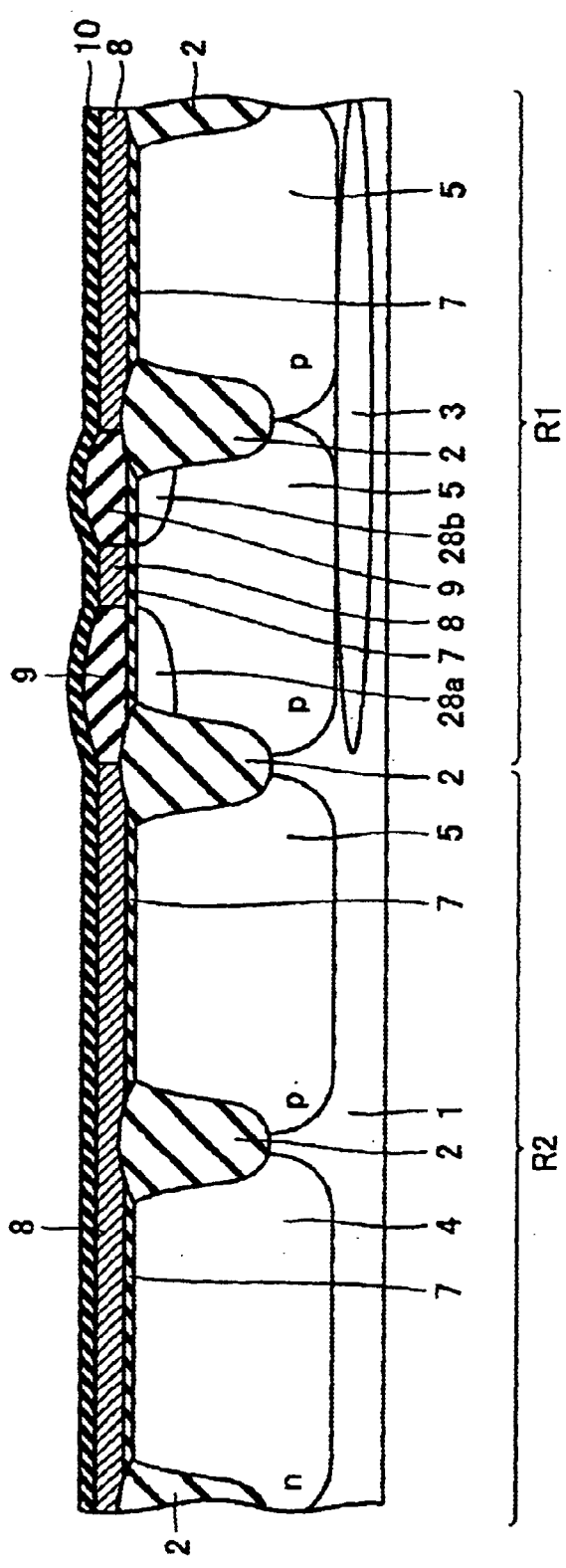
FIG. 27 is a sectional view showing a stage forming a three-layer insulator film for defining an inter-gate isolation film.

Then, a silicon oxide film of 5 nm in thickness is formed on the overall main surface of the silicon substrate 1 by thermal oxidation. Then, a silicon nitride film of 10 nm in thickness is formed thereon by low-pressure CVD. A silicon oxide film of 5 nm in thickness is formed thereon by low-pressure CVD, thereby forming a three-layer insulator film 10 (FIG. 27).

Thereafter a resist pattern is formed on the three-layer insulator film 10 and employed as a mask for removing parts of the three-layer insulator film 10 and the phosphorus-doped polycrystalline silicon film 8 from regions of the peripheral circuit part R2 to be formed with high withstand voltage transistors.

Figure 29:
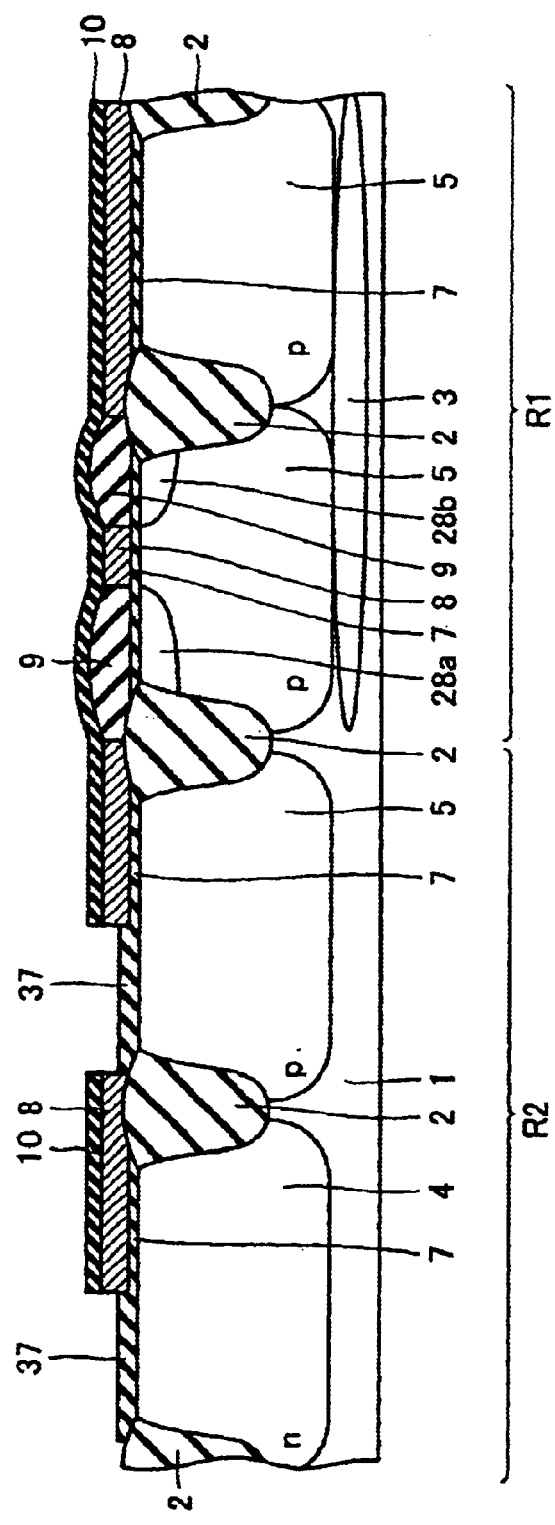
FIG. 29 is a sectional view showing a stage forming gate oxide films having a larger thickness than the gate oxide film on the exposed silicon substrate.

Then, silicon oxide films 37 of about 20 nm in thickness are formed on the silicon substrate 1 by thermal oxidation, as shown in FIG. 29. The silicon oxide films 37 define gate insulator films of the high withstand voltage transistors. In formation of the silicon oxide films 37, the silicon nitride film included in the three-layer insulator film 10 prevents the memory cell part R1 and surface parts of the silicon substrate 1 in regions of low withstand voltage transistors of the peripheral circuit part R2 from thermal oxidation.

Figure 30:
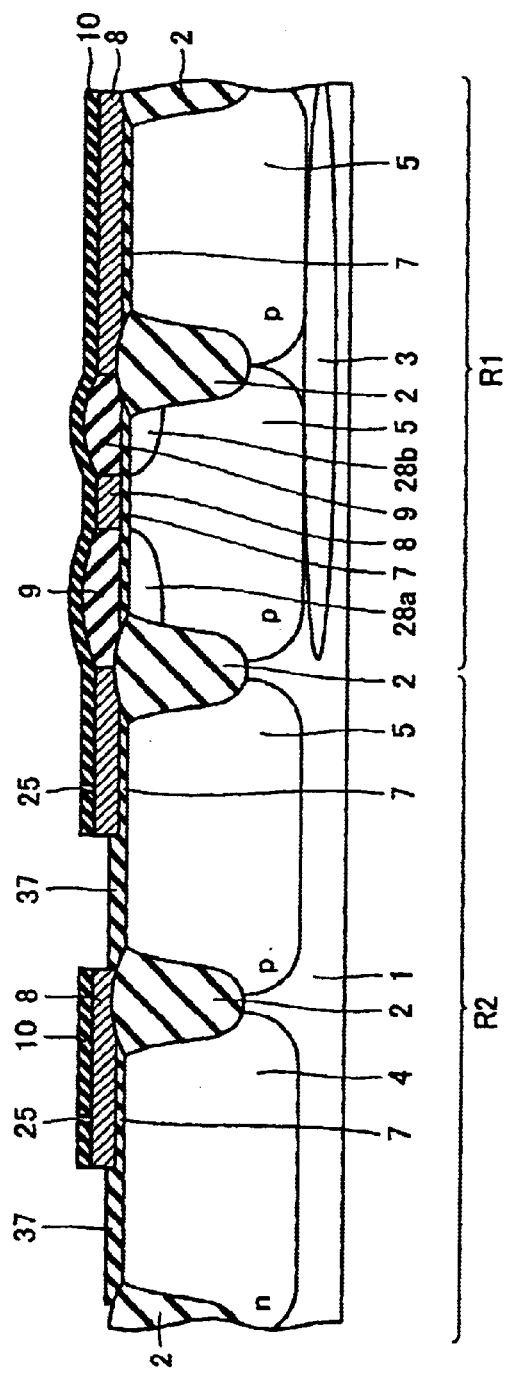
FIG. 30 is a sectional view showing a stage forming contact holes in the three-layer insulator film on regions of the peripheral circuit part for forming low withstand voltage transistors.

Then, contact holes 25 are opened to reach the phosphorus-doped polycrystalline silicon films 12 in the three-layer insulator films 10 on the regions of the peripheral circuit part R2 to be formed with the low withstand voltage transistors (FIG. 30).

Then, a phosphorus-doped polycrystalline silicon film 12 of 200 nm in thickness is formed on the three-layer insulator films 10 and the silicon oxide films 37 to fill up the contact holes 25. Then, a WSi film 13 of about 100 nm in thickness is formed on the phosphorus-doped polycrystalline silicon film 12, followed by formation of a silicon oxide film 14 of about 200nm in thickness. Thereafter a resist pattern is formed by photolithography and employed as a mask for patterning the silicon oxide film 14. The patterned silicon oxide films 14 are employed as masks for successively patterning the WSi film 13, the phosphorus-doped polycrystalline silicon film 12, the phosphorus-doped polycrystalline silicon film 11, the three-layer insulator films 10 and the phosphorus-doped polycrystalline silicon films 8 (FIG. 31).

Figure 31:
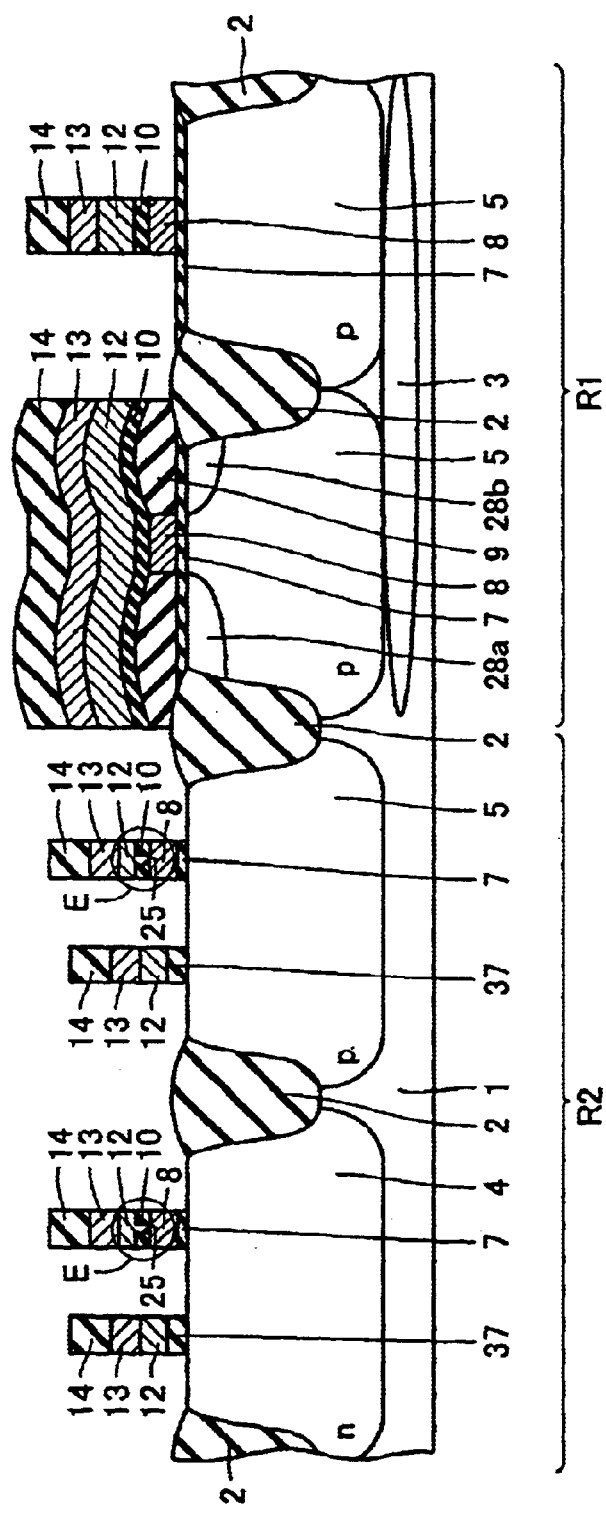
FIG. 31 is a sectional view showing a stage implanting phosphorus into the floating gate conductive layer on the regions for forming the low withstand voltage transistors and patterning gate portions of the transistors of the memory cell part and the peripheral circuit part.
Figure 32:
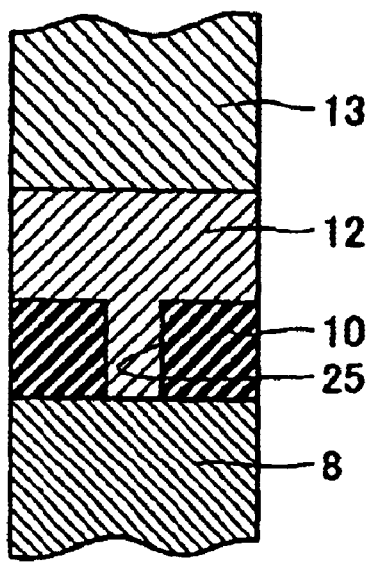
FIG. 32 is an enlarged view of a part E in FIG. 31.

FIG. 32 is an enlarged view of a part E shown in FIG. 31. The phosphorus-doped polycrystalline silicon film 12 defining the control gate is electrically connected to the floating gate 8 through the contact hole 25 formed in the three-layer insulator film 10.

Subsequent fabrication steps are carried out along the fabrication steps shown in FIGS. 16 to 20 with reference to the first embodiment.

In the nonvolatile semiconductor memory device according to this embodiment, an inter-gate isolation film isolates a floating gate and a control gate of the memory cell transistor in the memory cell part R1. In each low withstand voltage transistor of the peripheral circuit part R2, however, two conductive layers corresponding to a floating gate and a control gate are electrically connected with each other. In the low withstand voltage transistor, therefore, both of the conductive layers corresponding to the floating gate and the control gate respectively can be employed as gate electrodes. In the high withstand voltage transistor of the peripheral circuit part R2, a conductive layer corresponding to a control gate is employed for a gate electrode. Therefore, gate oxide films 7 of the memory transistor and the low withstand voltage transistor can be rendered in common. Consequently, an oxidation step can be immediately eliminated. Further, crystal defects caused in the silicon substrate 1 in thermal oxidation can be suppressed. In addition, the time of thermal oxidation applied to the memory cell part R1 is reduced, not to hinder refinement of the memory cell.

Fourth Embodiment

A nonvolatile semiconductor memory device according to a fourth embodiment of the present invention is identical in structure to the nonvolatile semiconductor memory device shown in FIG. 22. The feature of this embodiment resides in that the phosphorus concentration of phosphorus-doped polycrystalline silicon films 8 in a peripheral circuit part R2 is higher than that in the third embodiment.

A method of fabricating the nonvolatile semiconductor memory device according to the fourth embodiment is basically identical to the fabrication method according to the third embodiment. Steps identical to those shown in FIGS. 4 to 7 with reference to the first embodiment and those shown in FIGS. 24 to 31 with reference to the third embodiment are employed as such.

A silicon oxide film 7 of 10 nm in thickness is formed on the main surface of a silicon substrate 1 by thermal oxidation, as shown in FIG. 7. Then, a phosphorus-doped polycrystalline silicon film 8 of about 200 nm in thickness is formed on the silicon oxide film 7. Then, a resist pattern is formed on the phosphorus-doped polycrystalline silicon film 8 by photolithography and employed as a mask for patterning the phosphorus-doped polycrystalline silicon film 8 (refer to FIG. 24).

Arsenic is implanted into a region of a memory cell part R1 to be formed with a memory transistor with acceleration energy of 35 keV and density of 3.0E15, for example, through a resist pattern serving as a mask for forming n-conductivity type impurity regions 28a and 28b (refer to FIG. 25).

Thereafter a silicon oxide film 9 of 800 nm in thickness is deposited on the silicon substrate 1 by low-pressure CVD. Then, this silicon oxide film 9 is subjected to overall etching, thereby exposing the surface of the phosphorus-doped polycrystalline silicon film 8 (refer to FIG. 26).

Then, a silicon oxide film of 5 nm in thickness is formed on the overall main surface of the silicon substrate 1 by thermal oxidation. A silicon nitride film of 10 nm in thickness is formed thereon by low-pressure CVD. A silicon oxide film of 5 nm in thickness is formed thereon by low-pressure CVD, thereby forming a three-layer insulator film 10 (refer FIG. 27).

Figure 28:
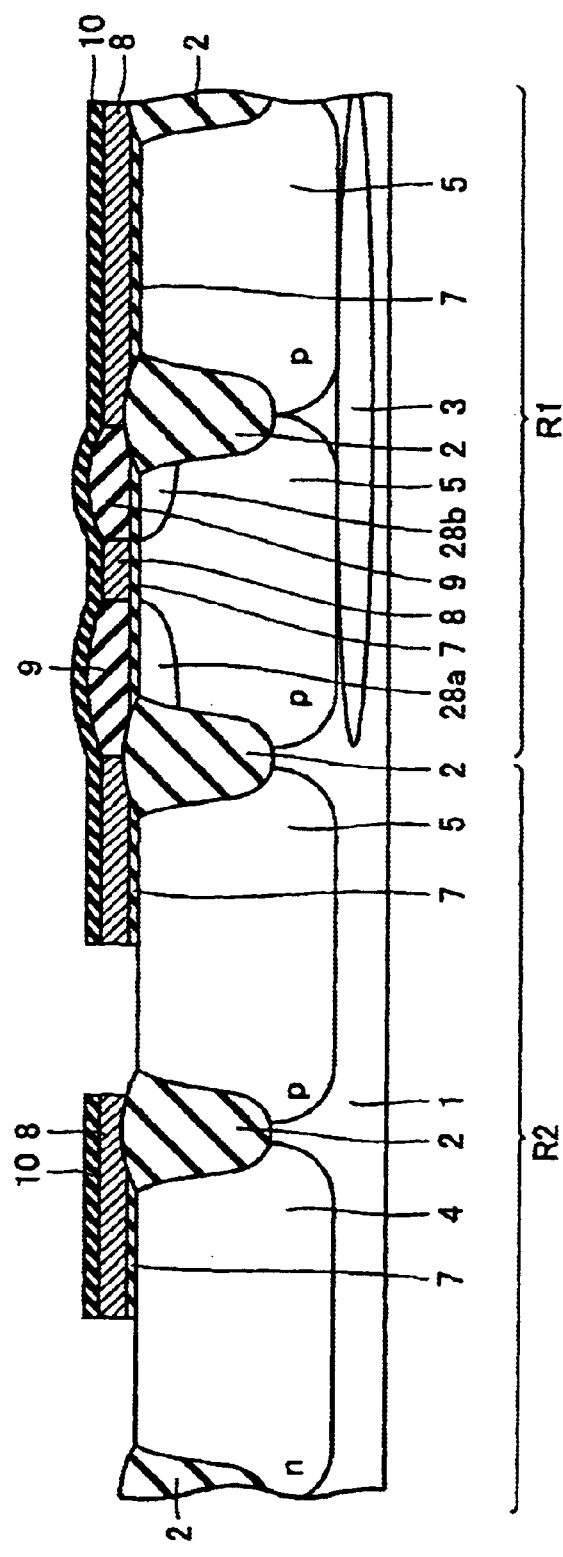
FIG. 28 is a sectional view showing a stage removing parts of a gate oxide film, a floating gate conductive layer and the three-layer insulator film located on regions for forming high withstand voltage transistors of a peripheral circuit part by etching and exposing the silicon substrate.

Thereafter a resist pattern is formed on the three-layer insulator film 10 and employed as a mask for removing parts of the three-layer insulator film 10 and the phosphorus-doped polycrystalline silicon film 8 from regions of the peripheral circuit part R2 formed with high withstand voltage transistors (refer to FIG. 28).

Then, silicon oxide films 37 of about 20 nm in thickness are formed on the silicon substrate 1 by thermal oxidation (refer to FIG. 29). The silicon oxide films 37 define gate insulator films of the high withstand voltage transistors. In formation of the silicon oxide films 37, the silicon nitride film included in the three-layer insulator film 10 prevents the memory cell part R1 and surface parts of the silicon substrate 1 in regions of low withstand voltage transistors of the peripheral circuit part R2 from thermal oxidation.

Then, contact holes 25 are opened to reach the phosphorus-doped polycrystalline silicon films 12 in the three-layer insulator films 10 on the regions of the peripheral circuit part R2 to be formed with the low withstand voltage transistors (refer to FIG. 30).

Figure 33:
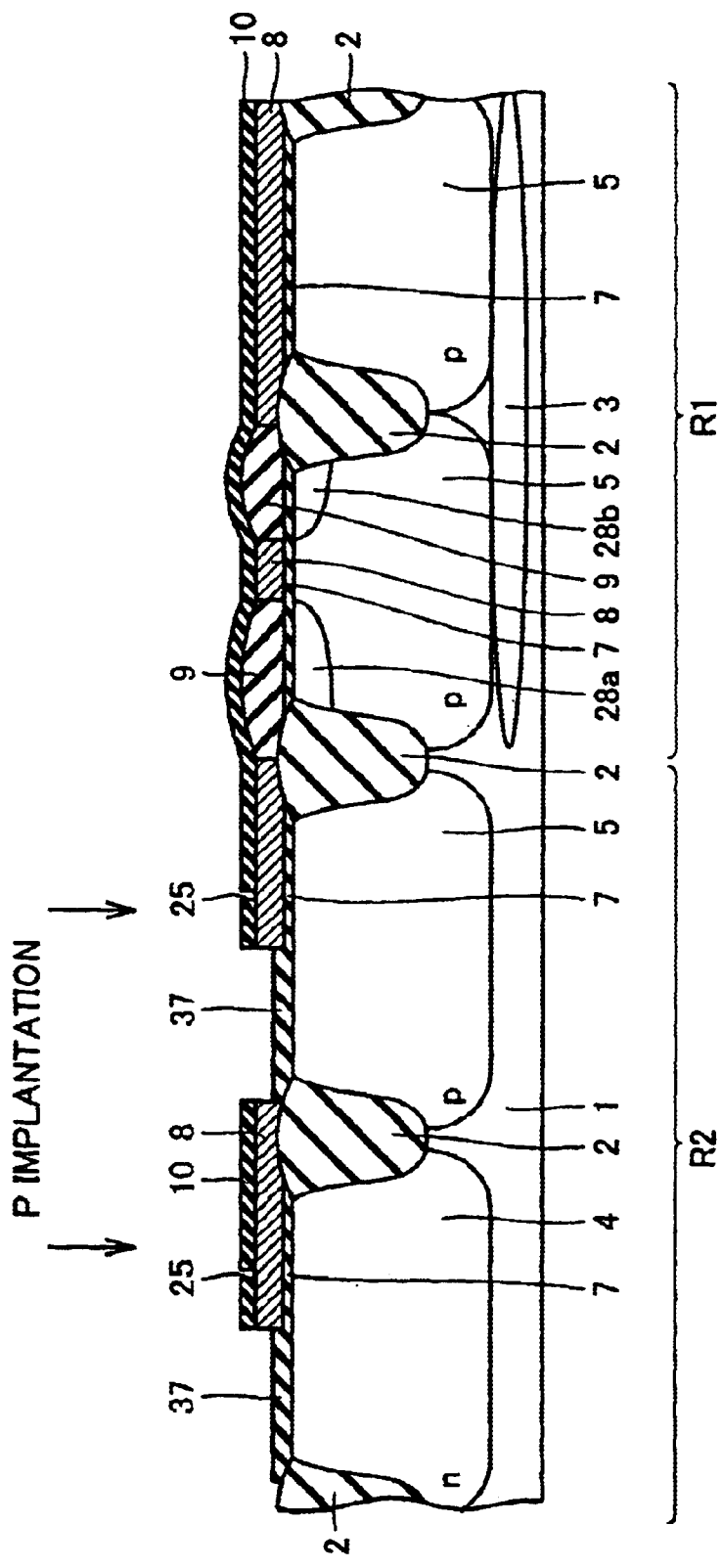
FIG. 33 is a sectional view showing a stage opening contact holes in a three-layer insulator film and thereafter further implanting phosphorus into a floating gate conductive layer of a peripheral circuit part in fabrication of a nonvolatile semiconductor memory device according to a fourth embodiment of the present invention.
Figure 34:
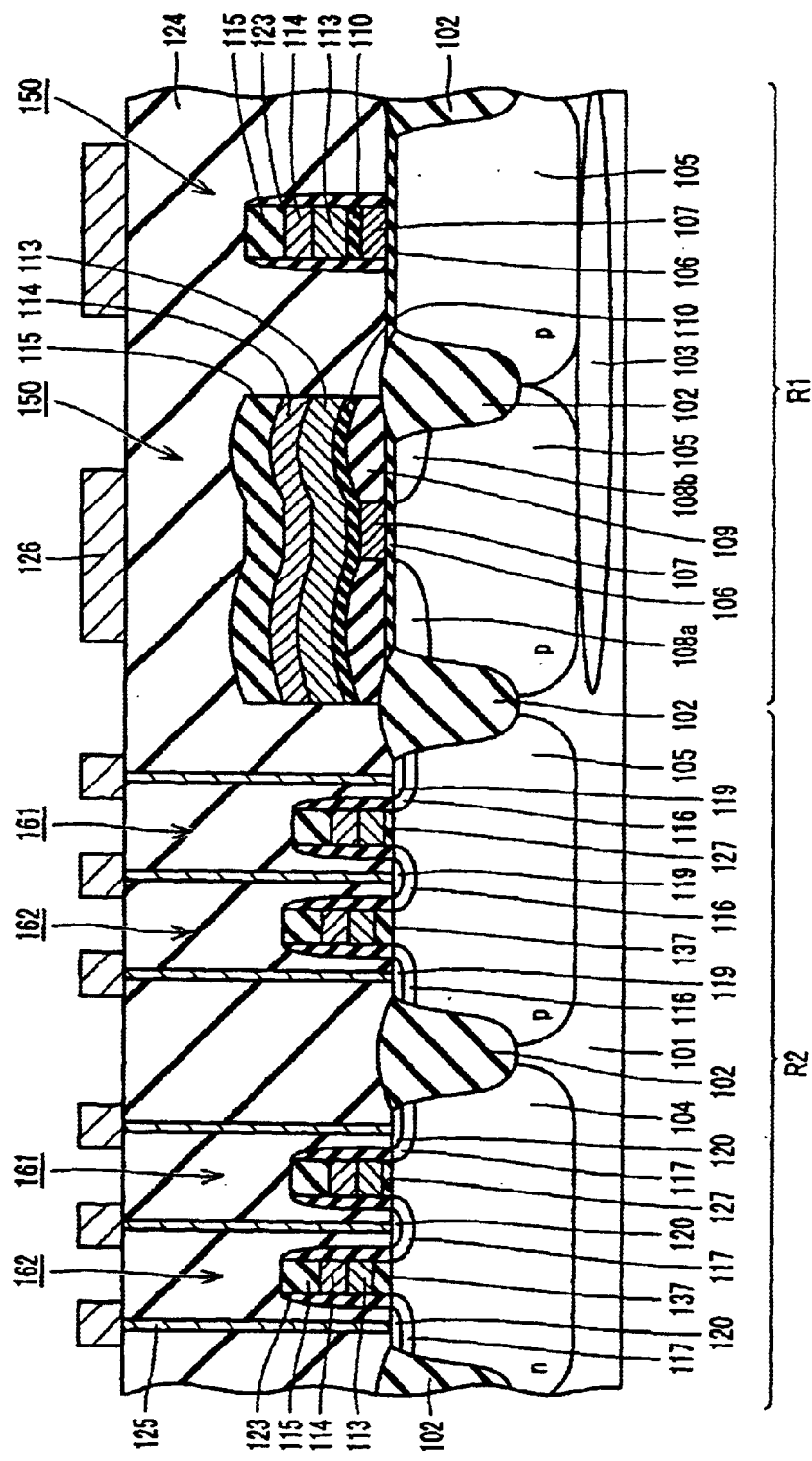
FIG. 34 is a sectional view of a conventional nonvolatile semiconductor memory device (Prior Art)
Figure 35:
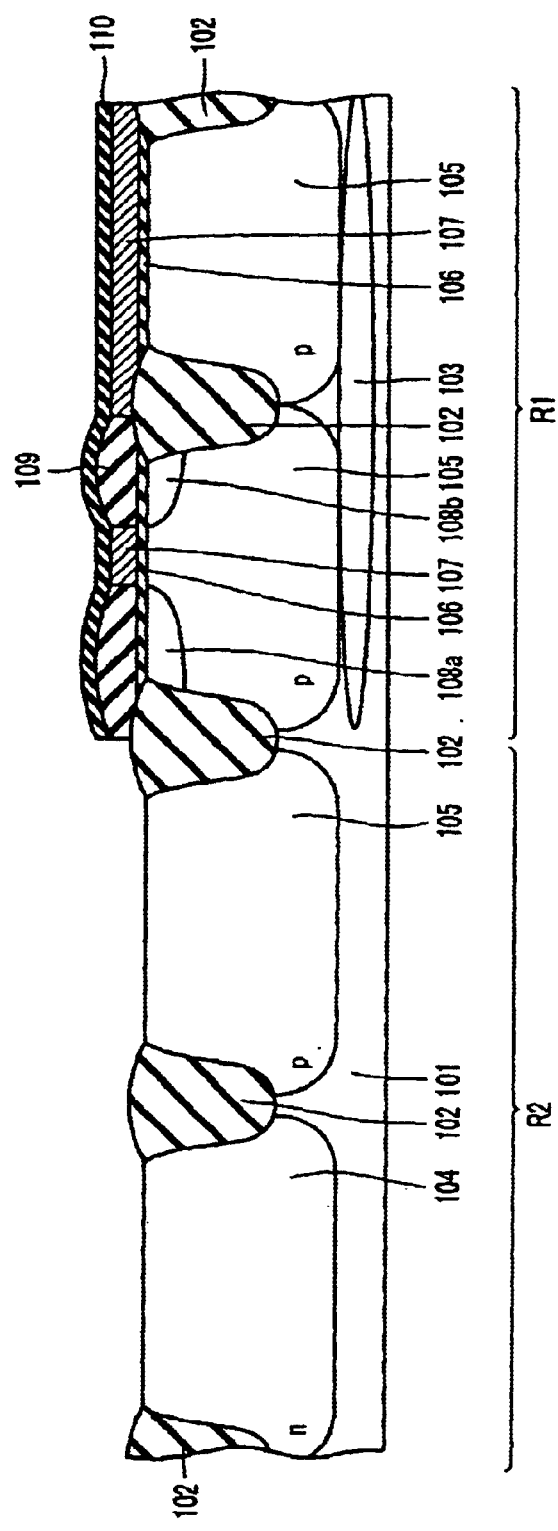
FIG. 35 is a sectional view showing a stage forming a gate oxide film, a floating conductive layer and a three-layer insulator film and thereafter partially removing the gate oxide film, the floating conductive layer and the there-layer insulator film in a peripheral circuit part for exposing a silicon substrate in the peripheral circuit part in fabrication of the nonvolatile semiconductor memory device shown in FIG. 34 (Prior Art)
Figure 36:
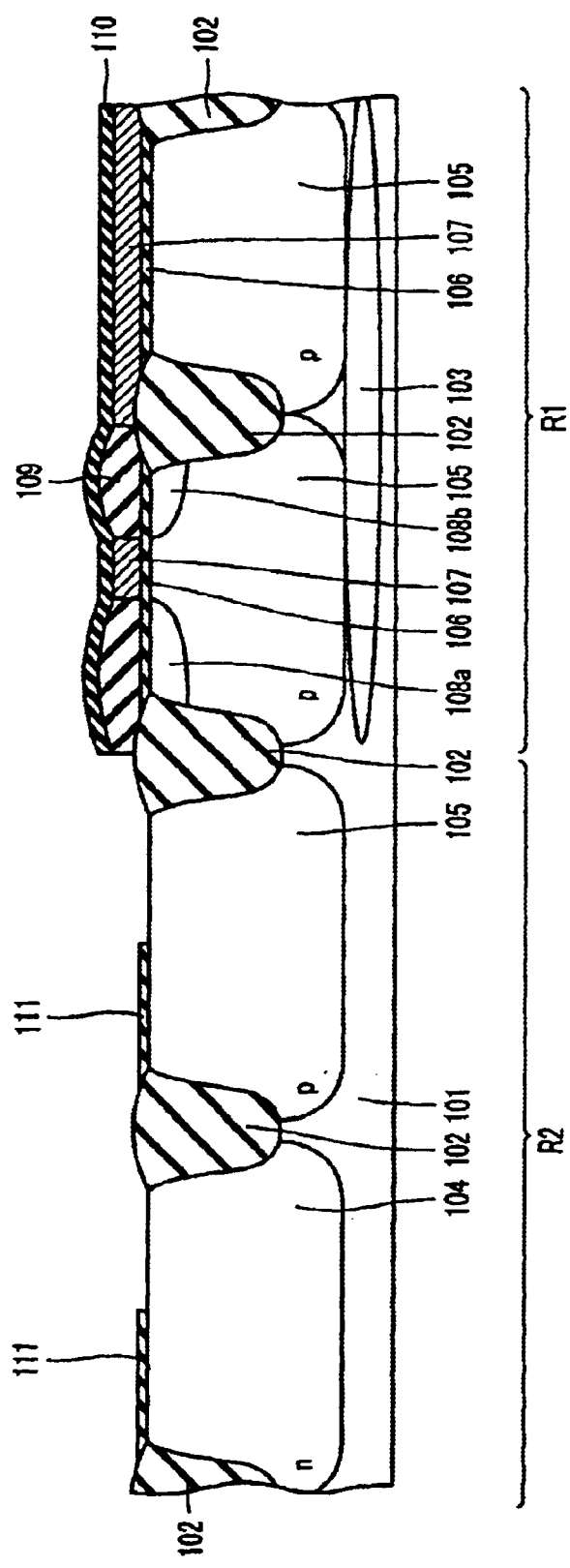
FIG. 36 is a sectional view showing a stage forming thick gate insulator films on regions of the peripheral circuit part for forming high withstand voltage transistors (Prior Art)
Figure 37:
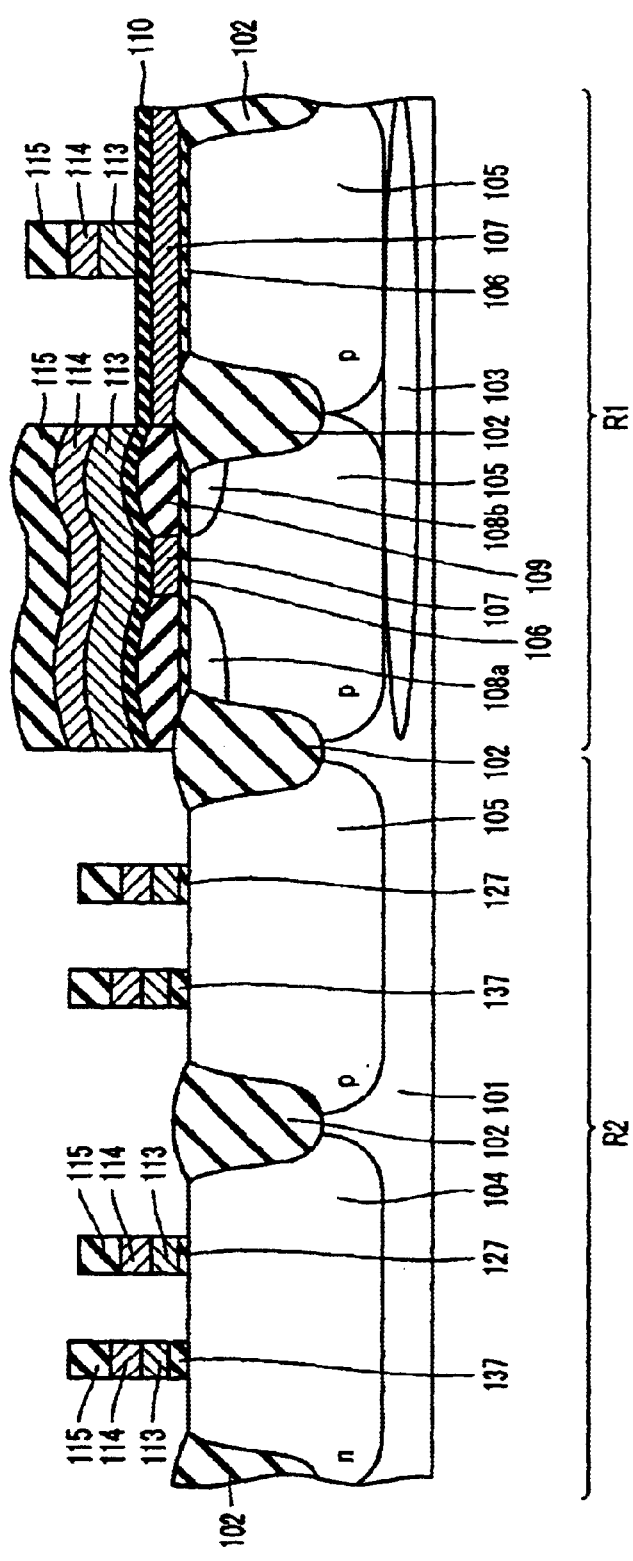
FIG. 37 is a sectional view showing a stage further forming a gate insulator film only on the peripheral circuit part, depositing a control gate conductive layer, a WSi layer and an insulating layer in ascending order over the peripheral circuit part and a memory cell part and patterning only gate portions of the transistors of the peripheral circuit part (Prior Art)
Figure 38:
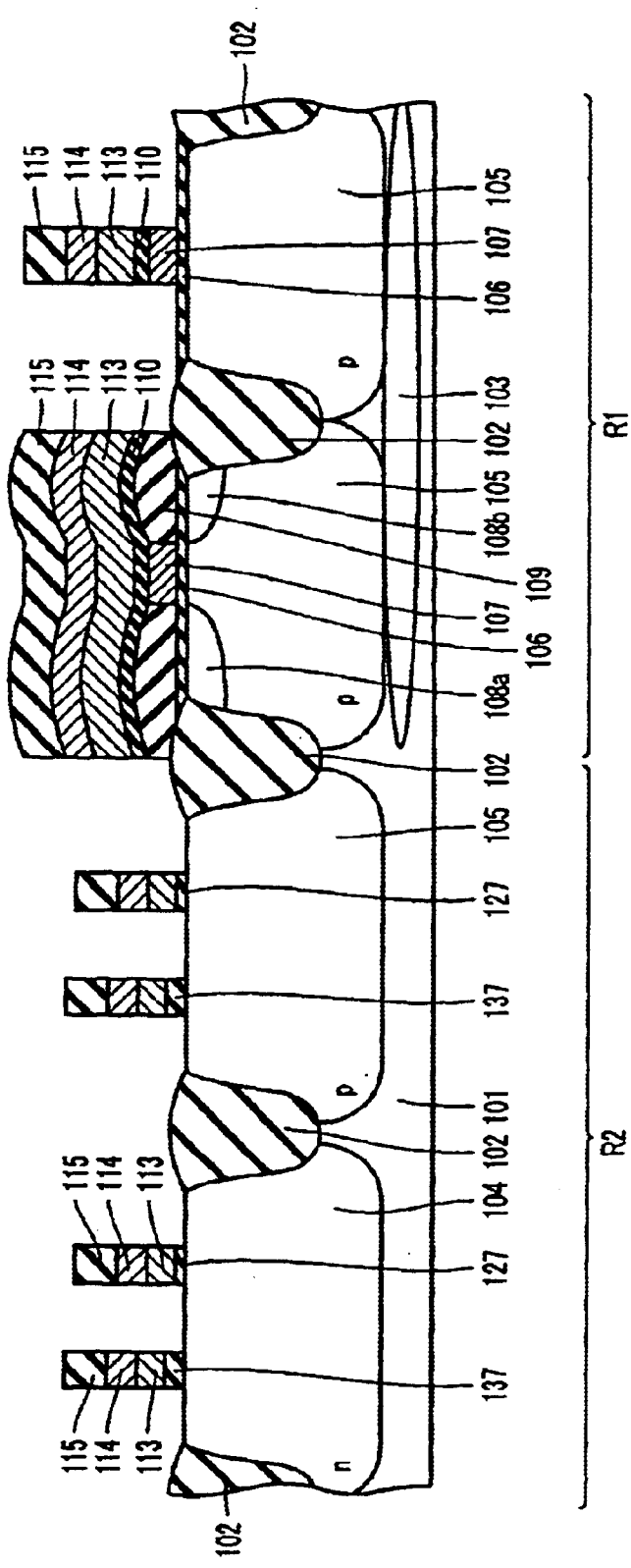
FIG. 38 is a sectional view showing a stage patterning a gate portion of a transistor of the memory cell part (Prior Art)
Figure 39:
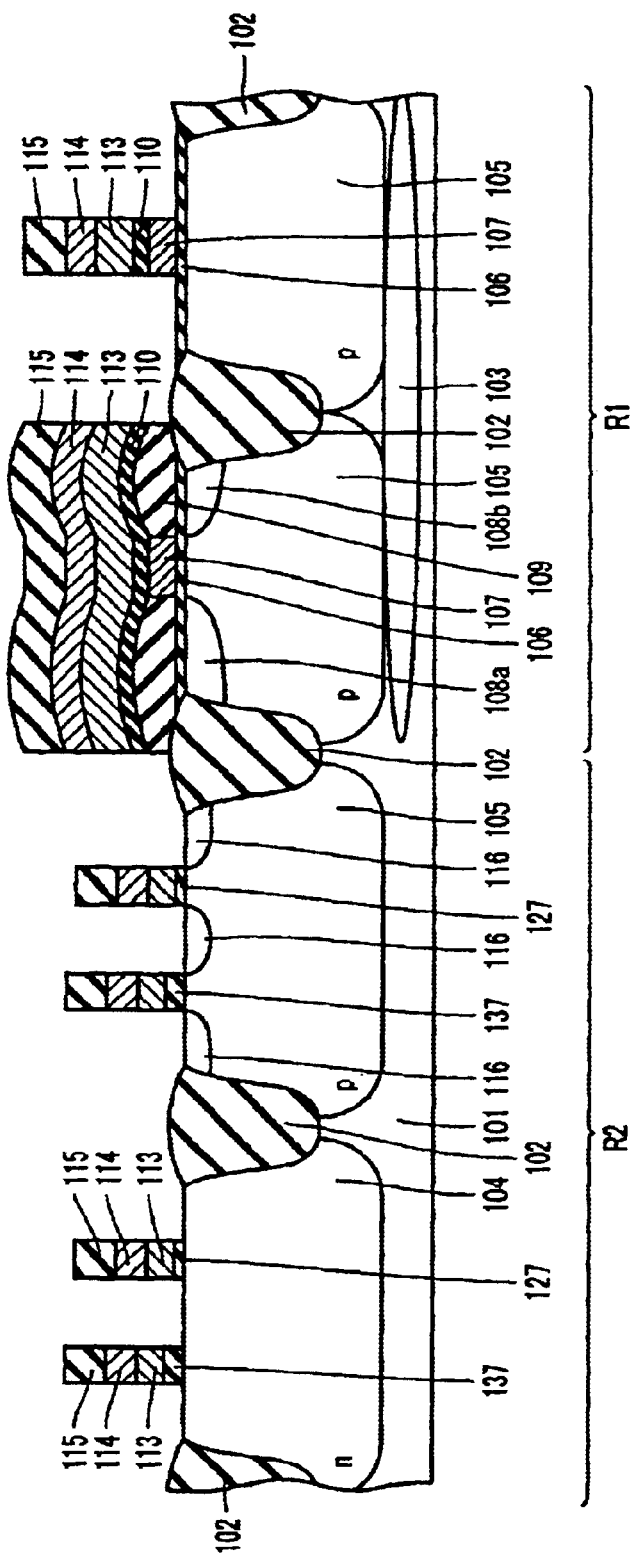
FIG. 39 is a sectional view showing a stage implanting an n-conductivity type impurity into regions of a silicon substrate for defining source and drain regions of n-conductivity type transistors of the peripheral circuit part (Prior Art)
Figure 40:
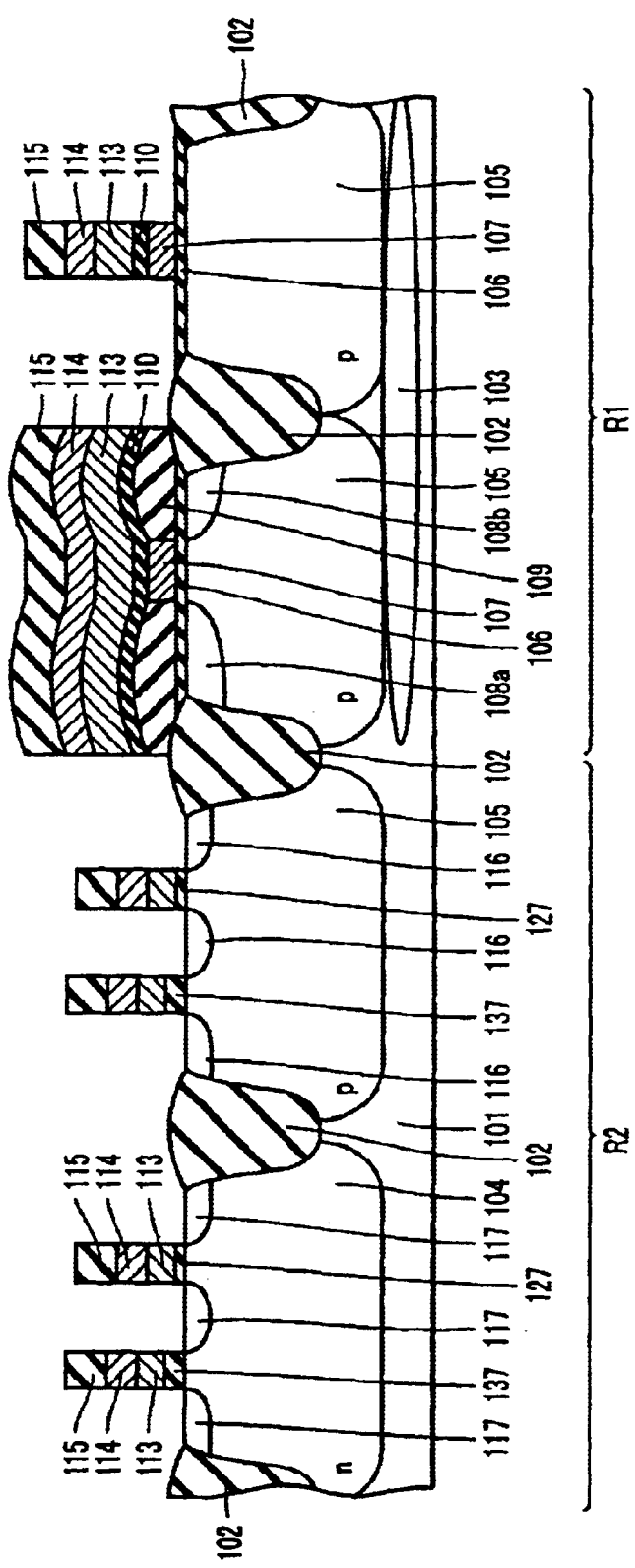
FIG. 40 is a sectional view showing a stage implanting a p-conductivity type impurity into regions of the silicon substrate for defining source and drain regions of p-conductivity type transistors of the peripheral circuit part (Prior Art)
Figure 41:
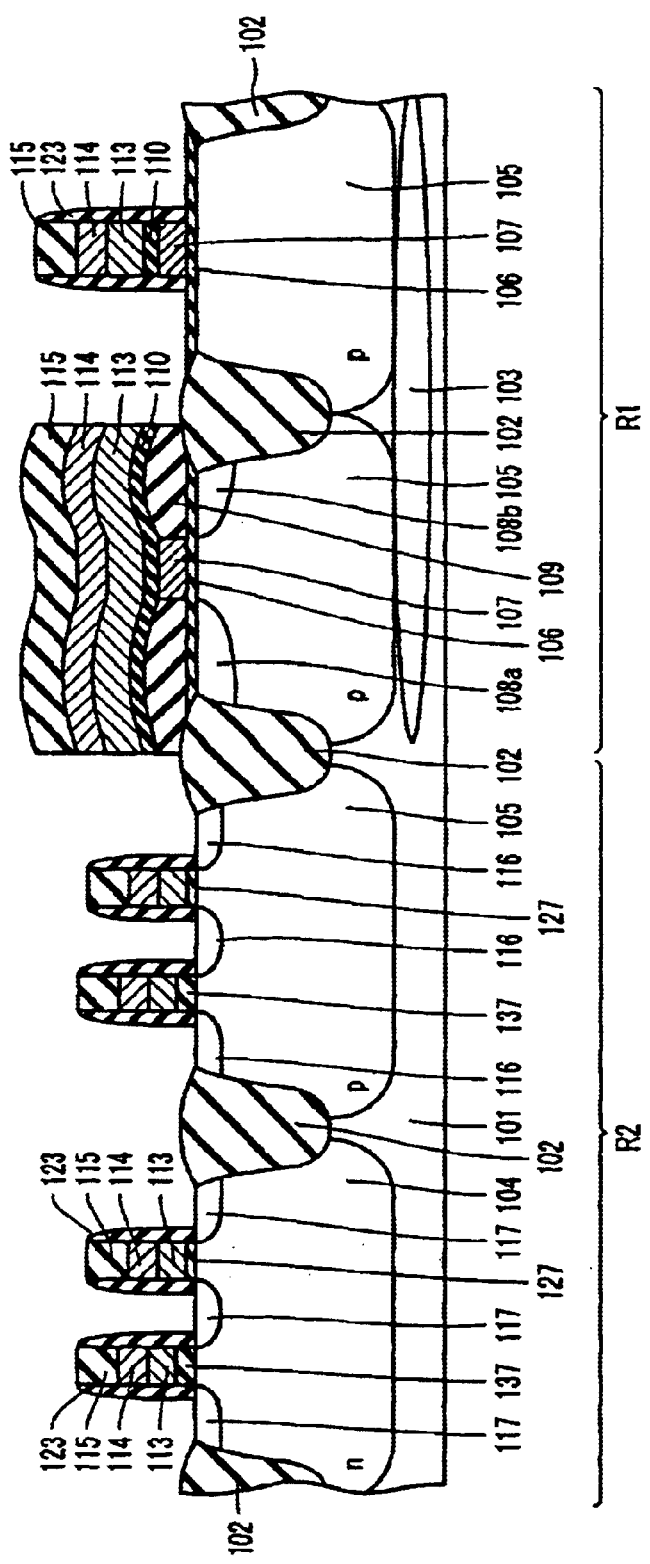
FIG. 41 is a sectional view showing a stage forming side wall spacers on the side surfaces of gate portions of the memory cell part and the peripheral circuit part (Prior Art)
Figure 42:
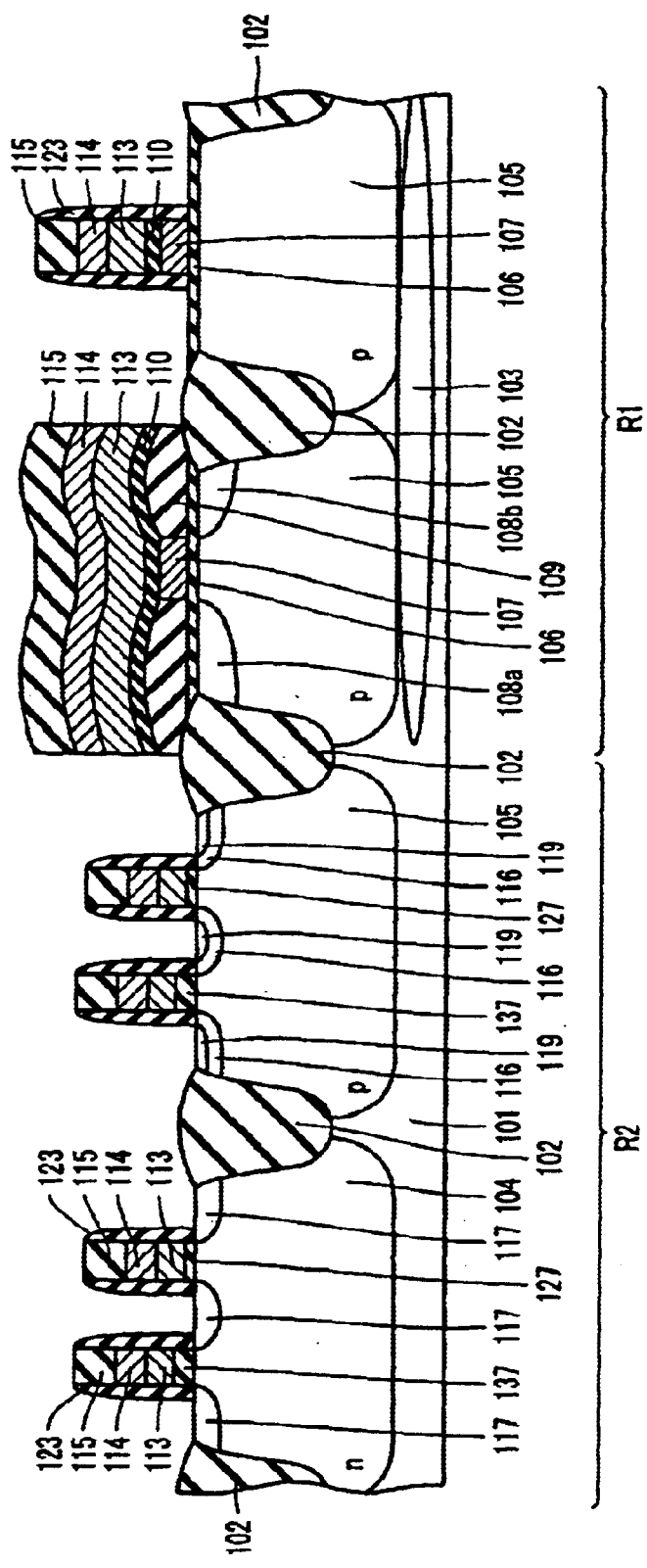
FIG. 42 is a sectional view showing a stage further implanting an n-conductivity type impurity into the source and drain regions of the n-conductivity type transistors through the side wall spacers serving as masks for forming high-concentration n-conductivity type impurity regions (Prior Art)
Figure 43:
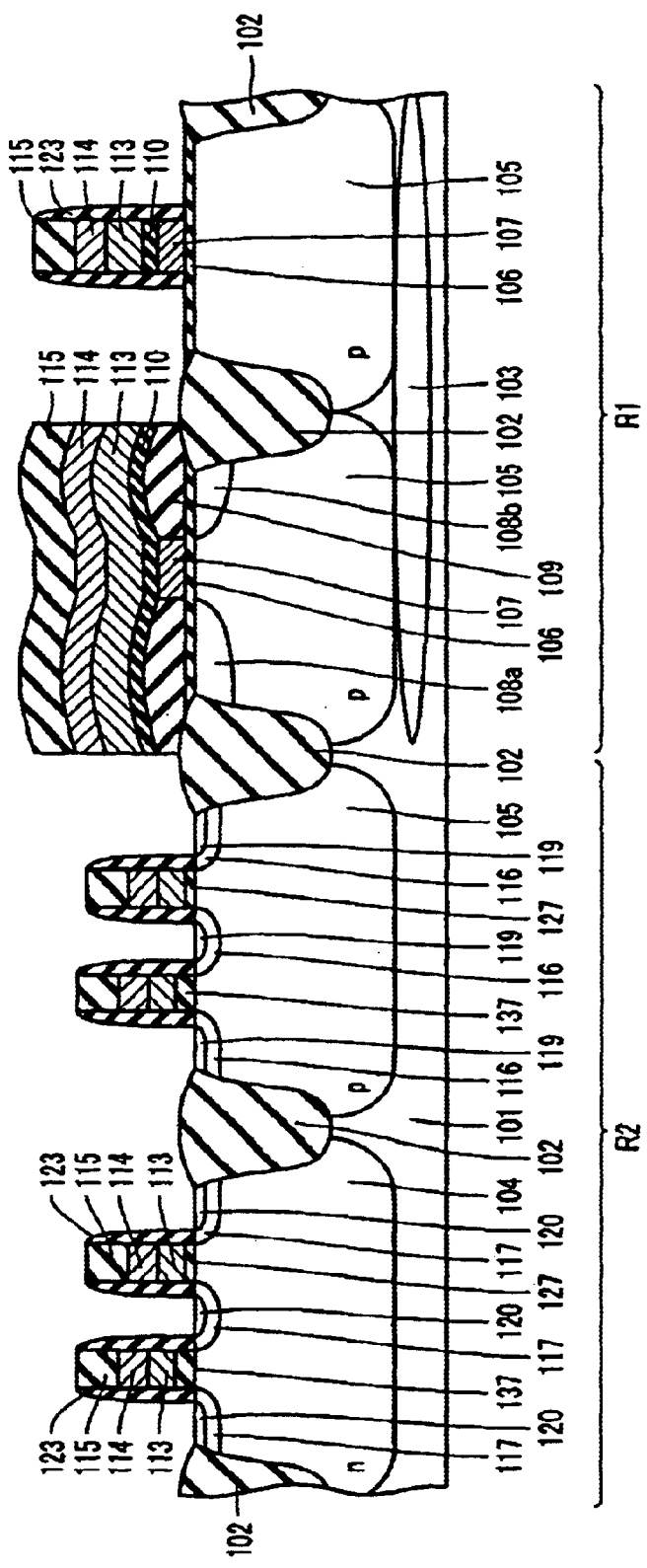
FIG. 43 is a sectional view showing a stage further implanting a p-conductivity type impurity into the source and drain regions of the p-conductivity type transistors through the side wall spacers serving as masks for forming high-concentration p-conductivity type impurity regions (Prior Art).

Thereafter phosphorus is ion-implanted into regions of the peripheral circuit part R2 to be formed with low withstand voltage transistors, as shown in FIG. 33. The impurity concentration of a phosphorus-doped polycrystalline silicon film is decided in response to characteristics required to a memory transistor. This impurity concentration, about 4 E20/cm$^3$, for example, is at a low level as the impurity concentration of a gate electrode treated as a conductive layer. Gate electrodes of the transistors of the peripheral circuit part R2 preferably have higher concentration, in order to suppress depletion of the gate electrodes. The impurity concentration of the gate electrodes of the low withstand voltage transistors of the peripheral circuit part R2 can be rendered higher than that of the gate electrode of the memory transistor by merely adding this ion implantation step.

The gate electrodes of the high withstand voltage transistors of the peripheral circuit part R2, identical to a conductive layer corresponding to a control gate of the memory transistor essentially having high impurity concentration, contain an impurity required to the gate electrodes of the transistors of the peripheral circuit part R2 with no particular requirement for processing of increasing the impurity concentration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising a memory cell part and a peripheral circuit part located in the periphery of said memory cell part on a semiconductor substrate, wherein said memory cell part includes a memory cell transistor having a floating gate located on a gate insulator film, an inter-gate isolation film located on said floating gate and a control gate located on said inter-gate isolation film and said peripheral circuit part includes a first transistor including a first gate insulator film and a second transistor including a second gate insulator film, each of said first and second transistors includes a lower conductive layer, an intermediate insulator film and an upper conductive layer located in ascending order on said gate insulator film in contact with each other, said lower conductive layer has the same thickness as said floating gate, said intermediate insulator film includes an insulator film of the same thickness as said inter-gate isolation film, said upper conductive layer has the same thickness as said conductive layer of said control gate, and said intermediate insulator film includes a conduction part electrically connecting said upper conductive layer and said lower conductive layer with each other, said first transistor has the first gate insulator film of the same thickness as said gate insulator film of said memory transistor on said semiconductor substrate, and said second transistor includes the second gate insulator film larger in thickness than said first gate insulator film on said semiconductor substrate, and said floating gate in said memory cell part and said lower conductive layer in said peripheral circuit part are made of doped silicon containing an impurity, and said lower conductive layer has higher impurity concentration than said floating gate.

2. The nonvolatile semiconductor memory device according to claim 1, wherein the thickness of said conductive layer of said control gate is larger than that of said floating gate.

3. The nonvolatile semiconductor memory device according to claim 2, wherein said second gate insulator film includes an insulator film of the same thickness as said first gate insulator film with addition of another insulator film.

4. The nonvolatile semiconductor memory device according to claim 2, wherein said peripheral circuit part further includes a doped silicon film containing an impurity between said intermediate insulator film and said upper conductive layer, and said conduction part is provided also in said doped silicon film.

5. A nonvolatile semiconductor memory device comprising a memory cell part and a peripheral circuit part located in the periphery of said memory cell part on a semiconductor substrate, wherein said memory cell part includes a memory cell transistor having a floating gate located on a gate insulator film, an inter-gate isolation film located on said floating gate and a control gate located on said inter-gate isolation film and said peripheral circuit part includes a first transistor including a first gate insulator film and a second transistor including a second gate insulator film, said first transistor includes a lower conductive layer, an intermediate insulator film and an upper conductive layer located in ascending order on said gate insulator film in contact with each other, said lower conductive layer has the same thickness as said floating gate, said intermediate insulator film includes an insulator film of the same thickness as said inter-gate isolation film, said upper conductive layer has the same thickness as said conductive layer of said control gate, and said intermediate insulator film includes a conduction part electrically connecting said upper conductive layer and said lower conductive layer with each other, said second transistor includes a conductive layer of the same thickness as said control gate on said second gate insulator film, said first transistor has the first gate insulator film of the same thickness as said gate insulator film of said memory transistor on said semiconductor substrate, and said second transistor includes the second gate insulator film larger in thickness than said first gate insulator film on said semiconductor substrate, and said floating gate in said memory cell part and said lower conductive layer in said peripheral circuit part are made of doped silicon containing an impurity, and said lower conductive layer has higher impurity concentration than said floating gate.

6. The nonvolatile semiconductor memory device according to claim 5, wherein the thickness of said conductive layer of said control gate is larger than that of said floating gate.

7. The nonvolatile semiconductor memory device according to claim 6, wherein said second gate insulator film includes an insulator film of the same thickness as said first gate insulator film with addition of another insulator film.

8. The nonvolatile semiconductor memory device according to claim 6, wherein said peripheral circuit part further includes a doped silicon film containing an impurity between said intermediate insulator film and said upper conductive layer, and said conduction part is provided also in said doped silicon film.

* * * * *

UNITED STATES PATENT AND TRADEMARK OFFICE
CERTIFICATE OF CORRECTION

PATENT NO.    : 6,657,249 B2
DATED         : December 2, 2003
INVENTOR(S)   : Naho Nishioka et al.

It is certified that error appears in the above-identified patent and that said Letters Patent is hereby corrected as shown below:

<u>Title Page,</u>
Item [73], Assignee, change "Mitsubishi Denki Kabushiki Kaisha, Tokyo (JP)" to
-- Renesas Technology Corp., Tokyo (JP) --

Signed and Sealed this

Twenty-fifth Day of May, 2004

JON W. DUDAS
*Acting Director of the United States Patent and Trademark Office*